(12) United States Patent  
Yamazaki et al.

(10) Patent No.: US 8,053,979 B2  
(45) Date of Patent: Nov. 8, 2011

(54) LIGHT-EMITTING ORGANIC COMPOUND WITH IMPROVED RELIABILITY

(75) Inventors: Shunpei Yamazaki, Setagaya (JP); Toshimitsu Konuma, Atsugi (JP); Mayumi Mizukami, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 631 days.

(21) Appl. No.: 11/522,461

(22) Filed: Sep. 18, 2006

(65) Prior Publication Data

US 2007/0007870 A1    Jan. 11, 2007

Related U.S. Application Data

(62) Division of application No. 10/684,410, filed on Oct. 15, 2003, now Pat. No. 7,112,374, which is a division of application No. 09/667,493, filed on Sep. 21, 2000, now Pat. No. 6,641,933.

(30) Foreign Application Priority Data

Sep. 24, 1999 (JP) .................... 11-271297  
Sep. 28, 1999 (JP) .................... 11-275391  
Nov. 26, 1999 (JP) .................... 11-336100  
Nov. 26, 1999 (JP) .................... 11-336119

(51) Int. Cl.  
*H01J 63/04* (2006.01)

(52) U.S. Cl. ........................ 313/506; 313/505

(58) Field of Classification Search ........... 313/498–512  
See application file for complete search history.

(56) References Cited

U.S. PATENT DOCUMENTS

| 4,853,296 | A | * | 8/1989 | Fukuyoshi | 428/623 |
| 5,032,472 | A | * | 7/1991 | Michel et al. | 428/704 |
| 5,068,204 | A | * | 11/1991 | Kukimoto et al. | 117/93 |
| 5,104,749 | A | | 4/1992 | Sato et al. | |
| 5,106,503 | A | * | 4/1992 | Ohmi et al. | 210/541 |
| 5,247,190 | A | | 9/1993 | Friend et al. | |
| 5,399,502 | A | | 3/1995 | Friend et al. | |
| 5,420,288 | A | | 5/1995 | Ohta et al. | |

(Continued)

FOREIGN PATENT DOCUMENTS

EP        0 399 508        11/1990

(Continued)

OTHER PUBLICATIONS

H. Schenk et al., "*Polymers for Light Emitting Diodes*," Euro Display Proceedings 1999, pp. 33-37.

(Continued)

*Primary Examiner* — Toan Ton  
*Assistant Examiner* — Fatima Farokhrooz  
(74) *Attorney, Agent, or Firm* — Eric J. Robinson; Robinson Intellectual Property Law Office, P.C.

(57) ABSTRACT

By repeating a purification process of a light-emitting organic compound several times, a thin film made of the light-emitting organic compound to be used in an EL display device contains ionic impurities at the concentration of 0.1 ppm or lower and has a volume resistivity in the range of $3 \times 10^{10}$ $\Omega$cm or larger. By using such a thin film as a light-emitting layer in the EL device, a current caused by reasons other than the carrier recombination can be prevented from flowing through the thin film, and deterioration caused by unnecessary heat generation can be suppressed. Accordingly, it is possible to obtain an EL display device with high reliability.

42 Claims, 11 Drawing Sheets

U.S. PATENT DOCUMENTS

| | | | |
|---|---|---|---|
| 5,558,904 A | 9/1996 | Hsieh et al. | |
| 5,597,925 A | 1/1997 | Ohta et al. | |
| 5,610,309 A | 3/1997 | Ohta et al. | |
| 5,656,401 A | 8/1997 | Ohta et al. | |
| 5,684,365 A | 11/1997 | Tang et al. | |
| 5,909,038 A | 6/1999 | Hwang et al. | |
| 6,074,575 A * | 6/2000 | Sugioka et al. | 252/301.4 S |
| 6,114,183 A | 9/2000 | Hamada et al. | |
| 6,117,965 A | 9/2000 | Hwang et al. | |
| 6,147,451 A | 11/2000 | Shibata et al. | |
| 6,201,343 B1 | 3/2001 | Spindt et al. | |
| 6,259,203 B1 | 7/2001 | Kawamura et al. | |
| 6,300,612 B1 | 10/2001 | Yu | |
| 6,312,837 B1 | 11/2001 | Kijima | |
| 6,344,283 B1 | 2/2002 | Inoue et al. | |
| 6,392,340 B2 * | 5/2002 | Yoneda et al. | 313/506 |
| 6,406,802 B1 * | 6/2002 | Arai et al. | 428/690 |
| 6,423,428 B1 | 7/2002 | Towns et al. | |
| 6,504,300 B2 | 1/2003 | Kawamura et al. | |
| 6,605,823 B1 | 8/2003 | Pichler et al. | |
| 6,617,051 B1 | 9/2003 | Higashi et al. | |
| 6,623,872 B2 | 9/2003 | Inoue et al. | |
| 6,641,933 B1 | 11/2003 | Yamazaki et al. | |
| 6,661,454 B1 | 12/2003 | Hwang et al. | |
| 7,097,918 B2 | 8/2006 | Inoue et al. | |
| 7,151,341 B2 | 12/2006 | Pichler et al. | |
| 2002/0017858 A1 * | 2/2002 | Miyaguchi et al. | 313/498 |
| 2006/0186794 A1 | 8/2006 | Pichler et al. | |
| 2009/0017191 A1 | 1/2009 | Pichler et al. | |

FOREIGN PATENT DOCUMENTS

| | | |
|---|---|---|
| EP | 0891121 A | 1/1999 |
| EP | 0895442 A | 2/1999 |
| JP | 02-311591 | 12/1990 |
| JP | 05-279371 A | 10/1993 |
| JP | 07153864 * | 6/1995 |
| JP | 409241603 A * | 9/1997 |
| JP | 10-092576 | 4/1998 |
| JP | 11-054271 A | 2/1999 |
| JP | 11-171801 | 6/1999 |
| WO | WO90/13148 | 11/1990 |
| WO | WO-98/04610 | 2/1998 |
| WO | WO-98/05187 | 2/1998 |
| WO | WO-98/30071 | 7/1998 |

OTHER PUBLICATIONS

European Search Report for EP 00 12 0773 dated Mar. 2, 2005.

T. Tsutsui et al., *Effect of Impurity Ions and Permanent Dipoles for Device Performance of Thin-Film Electroluminescent Diodes*, Material Research Society Symposia Proceedings, vol. 488, pp. 611-616, 1998.

D. Zou et al., "Study on the Degradation Mechanism of Organic Light-Emitting Diodes (OLEDs)," Synthetic Metals 91 (1997), pp. 191-193.

Zou, D., et al., "Improvement of Current-Voltage Characteristics in Organic Light Emitting Diodes by Application of Reversed-Bias Voltage," Jpn. J. Appl. Phys. (Japanese Journal of Applied Physics), Nov. 15, 1998, vol. 37, Part 2, No. 11B , pp. L1406-L1408.

Wu, C., et al., "Integration of Organic LED's and Amorphous Si TFT's onto Flexible and Lightweight Metal Foil Substrates," IEEE Electron Device Letters, Dec. 1, 1997, vol. 18 , No. 12, pp. 609-612.

Kijima, Y., et al., "RGB Luminescence from Passive-Matrix Organic LED's," IEEE Transactions on Electron Devices, Aug. 1, 1997, vol. 44 , No. 8, pp. 1222-1228.

Official Communication (Application No. 00120773.7) Dated Feb. 26, 2010.

H. Schenk et al., "*Polymers for Light Emitting Diodes*," EuroDisplay '99: The 19$^{th}$ International Display Research Conference, pp. 33-37.

* cited by examiner

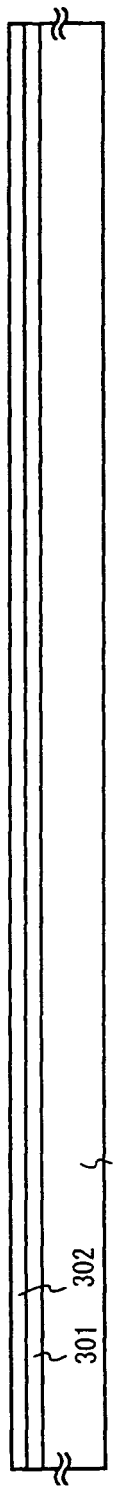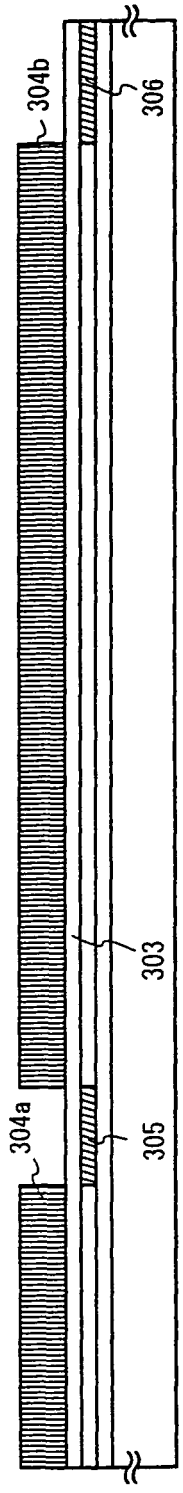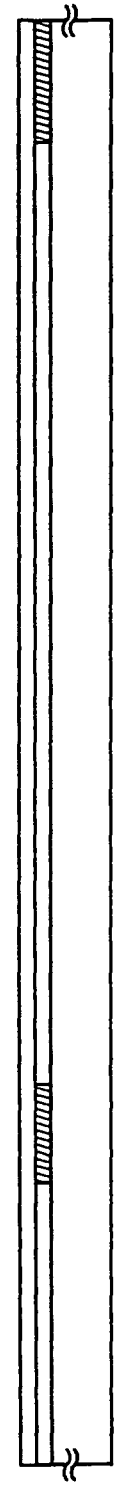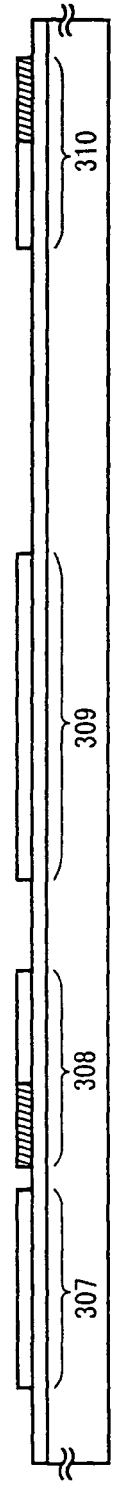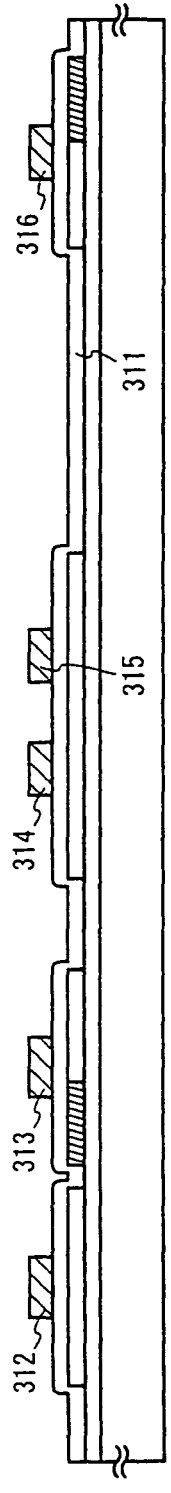

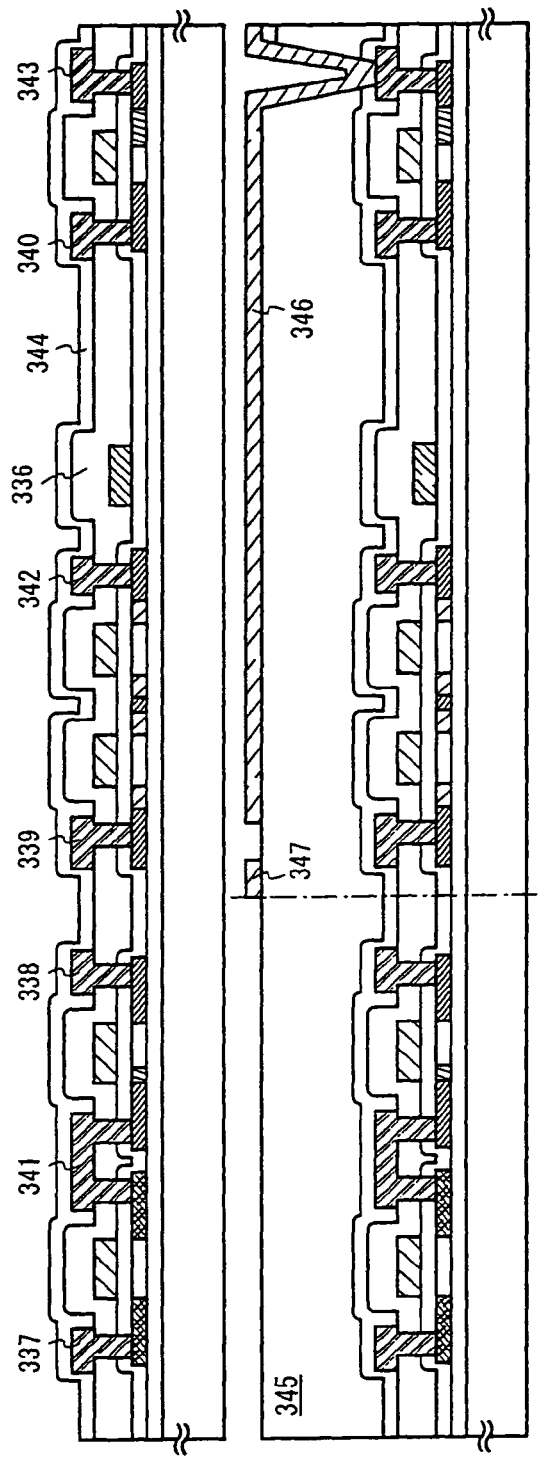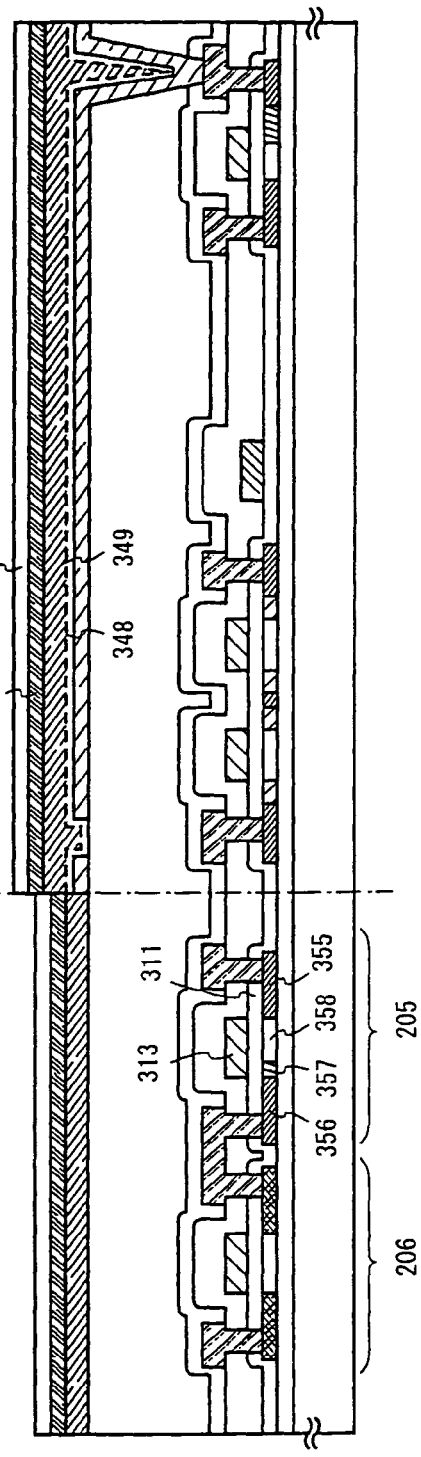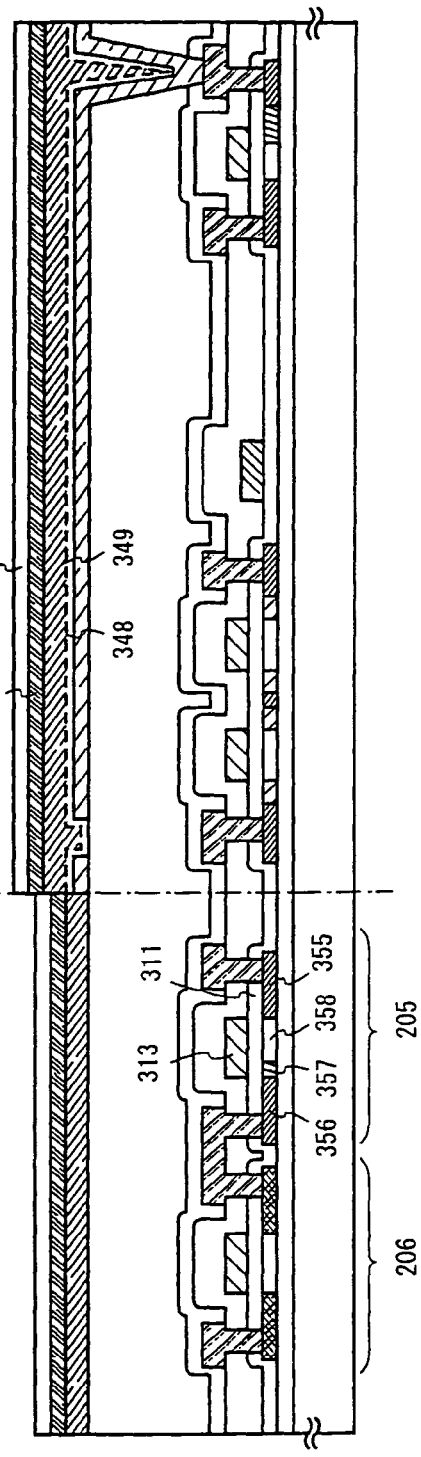

US 8,053,979 B2

LIGHT-EMITTING ORGANIC COMPOUND WITH IMPROVED RELIABILITY

BACKGROUND OF THE INVENTION

1. Field of the Invention

The present invention relates to a light-emitting organic compound (including a complex that contains a metal in its molecular formula) capable of providing Electro Luminescence (EL), and an EL display device utilizing the same. Typically, the present invention relates to a high-molecular type EL display device which utilizes a light-emitting organic compound made of a high-molecular compound.

The present invention also relates to an electronic apparatus including the above-mentioned EL display device as its display portion. It should be noted that the above-mentioned EL display device will be also referred to as the OLED (Organic Light-emitting Diode).

2. Description of the Related Art

Development of a display device including an EL layer as a self-light emitting element that utilizes EL phenomenon (i.e., the EL display device) has been proceeded in these years. Since the EL display device is of the self-light emitting type, no back light is required to be contained therein, unlike a liquid crystal display device or the like. Moreover, the EL display device exhibits a wide viewing angle. From the above features, the EL display device is advantageous to be used as a display portion for a portable device which is likely to be used outdoors.

A light-emitting layer as a principal portion of the EL element is made of an insulating material. When a voltage is applied across a cathode and an anode with the light-emitting layer interposed therebetween, carriers (electrons and holes) are injected into the light-emitting layer and recombined to emit light. Thus, a current flowing through the light-emitting layer is caused by the recombination of carriers. An EL material that can be used for the EL display device is described in, for example, Japanese Patent Application Laid-Open No. Hei 2-311591.

In a light-emitting element such as a light-emitting diode in which a semiconductor junction is formed, Na (sodium) that may exhibit an adverse effect as a movable ion causes a resistance value of the light-emitting layer to decrease, and therefore, can cause a current flow other than that caused by the carrier recombination. When such an unnecessary current flows, an amount of heat generation is increased and the light-emitting layer is more likely to deteriorate. The same disadvantage may occur in the EL device. However, any sufficient countermeasure against the disadvantage caused by the movable ion has not been provided for the EL material.

SUMMARY OF THE INVENTION

The present invention is intended to provide an EL display device with high reliability. The present invention is also intended to provide an electronic apparatus with a highly reliable display portion by utilizing such an EL display device as its display portion.

In accordance with the present invention, in order to prevent a current from flowing due to reasons other than the carrier recombination, a volume resistivity of a thin film made of a light-emitting organic compound in an EL device is set to be in the range of $3\times10^{10}$ Ωcm or larger. A volume resistivity of a thin film made of a light-emitting organic compound in an EL device is set to be in the range from $1\times10^{11}$ to $1\times10^{12}$ Ωcm (preferably, in the range from $1\times10^{12}$ to $1\times10^{13}$ Ωcm). In order to obtain the volume resistivity value in the above range, the concentration of ionic impurities contained in the thin film made of the light-emitting organic compound is set to be equal to 0.1 ppm or lower (preferably, equal to 0.01 ppm or lower). The ionic impurity refers to an element belonging to Group I or II in the periodic table, and typically to sodium (Na) or potassium (K).

Accordingly, in order to obtain the above-mentioned structure, it is necessary to use such a light-emitting organic compound that contains ionic impurities at the concentration of 0.1 ppm or lower (preferably, at the concentration of 0.01 ppm or lower).

In the case of sodium, the above-mentioned concentration range can be calculated to be $7\times10^{17}$ atoms/cm$^3$ or lower (preferably, $7\times10^{16}$ atoms/cm$^3$ or lower). However, it is appropriate to consider that the total concentration of all of the ionic impurities should meet the above-mentioned concentration range.

When a light-emitting organic compound made of a low-molecular compound (hereinafter, referred to as the low-molecular type EL compound) is used for obtaining the above-mentioned light-emitting organic compound, the low-molecular type EL compound can be purified by a zone purification method, a sublimation purification method, a recrystallization method, a distillation method, a filtration method, a column chromatography method, or a reprecipitation method.

On the other hand, when a light-emitting organic compound made of a high-molecular compound (hereinafter, referred to as the high-molecular type EL compound) is used, values of molecular weight are likely to vary over a certain range since degree of polymerization cannot be completely controlled. Thus, a melting temperature of the resultant material cannot be decided unambiguously at a certain value, and therefore, it becomes difficult to perform purification. In this case, it is appropriate to perform a dialysis method or a high-performance liquid chromatography method. In particular, it is appropriate to perform an electrodialysis method for efficiently eliminating ionic impurities in the dialysis method.

In either of the above-mentioned purification methods, a purification process is required to be repeated several times in order to reduce the concentration of the ionic impurities to a level of 0.1 ppm or lower. More specifically, it is desirable to repeat a purification process at least three times or more, and more preferably, five times or more. Instead of repeating the same purification process, it is of course possible to perform two or more different processes.

In the case where the filtration method is employed, it is preferable to use a filter provided with openings having a diameter of 0.1 μm (this diameter is particularly referred to as the diameter of particle-eliminating opening). Preferably, a filter with openings having a diameter of 0.05 μm is used. A filter provided with openings having a diameter of 0.1 μm only allows particles having a diameter of 0.1 μm or smaller to pass therethrough. Similarly, a filter provided with openings having a diameter of 0.05 μm only allows particles having a diameter of 0.05 μm or smaller to pass therethrough.

As set forth above, in accordance with the present invention, a light-emitting organic compound containing ionic impurities at the concentration of 0.1 ppm or lower (preferably, at the concentration of 0.01 ppm or lower) is formed, and by using it, an EL device including a thin film made of a light-emitting organic compound having a volume resistivity in the range of $3\times10^{10}$ Ωcm or larger. A volume resistivity of a thin film made of a light-emitting organic compound in an EL device is set to be in the range of $1\times10^{11}$ to $1\times10^{12}$ cm (preferably, in the range from $1 \times 10^{12}$ to $1 \times 10^{13}$ Ωcm) is formed so as to fabricate an EL display device by utilizing such an EL device.

For the light-emitting organic compound to be used in the present invention, as the low-molecular type EL compound, a compound having a molecular weight in the range of $1 \times 10^2$ to $8 \times 10^2$ g/mol (typically, in the range of $3 \times 10^2$ to $5 \times 10^2$ g/mol) can be used, while a compound having a molecular weight in the range of $8 \times 10^2$ to $2 \times 10^6$ g/mol (typically, in the range of $1 \times 10^4$ to $1 \times 10^5$ g/mol) can be used as the high-molecular type EL compound.

The typical low-molecular type EL compounds that can be used in the present invention include Alq$_3$ (tris-8-quinolinolato aluminum complex). Its molecular formula can be expressed as shown in Formula 1 below.

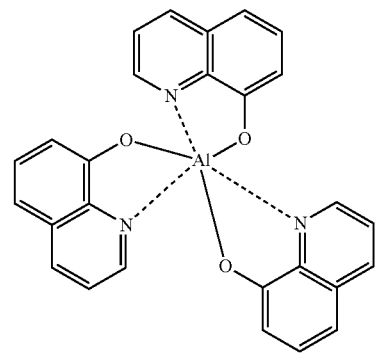

[Formula 1]

The other possible compounds include distyl allylene amine derivative that can be obtained by adding amino-substituted DSA to DSA (distyl allylene derivative). DSA can be expressed by Formula 2 below.

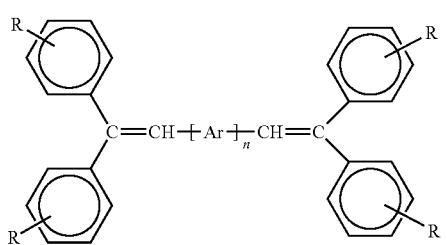

[Formula 2]

The typical high-molecular type EL compounds that can be used in the present invention include PPV (polyphenylenevinylene), which includes various types. For example, the molecular formulas 3 and 4, shown below, have been presented (in the article by H. Shenk, H. Becker, O. Gelsen, E. Kluge, W. Kreuder, and H. Spreitzer entitled "Polymers for Light-emitting Diodes" in Euro Display Proceedings 1999, pp.33-37).

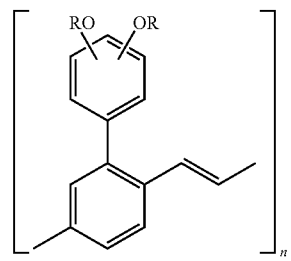

[Formula 3]

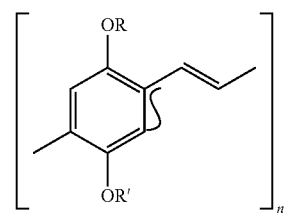

[Formula 4]

Alternatively, polyphenylvinyl having a molecular formula as described in Japanese Patent Application Laid-Open No. Hei 10-92576, as shown in Formulas 5 and 6, below, can also be used.

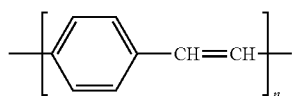

[Formula 5]

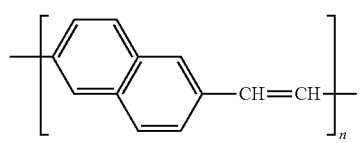

[Formula 6]

Various methods can be employed for forming a thin film of the above-mentioned high-molecular type EL compounds. In particular, a spin coating method is preferred in view of simplicity in its process. More specifically, in the spin coating method, a solute which forms a thin film is dissolved in a solvent and the obtained solution is applied to an underlying member by means of a spinner or the like. Thereafter, the solvent is volatilized in a baking process to form a thin film.

In accordance with the present invention, a solvent containing a high-molecular type EL compound is applied by means of a spinner, and a heat treatment is then performed at a temperature that is sufficiently low for preventing crystallization of the high-molecular type EL compound (specifically, at a glass-transition temperature or lower) so as to volatilize the solvent. As a result, a thin film made of the high-molecular type EL compound can be formed on the substrate.

Furthermore, since a light-emitting organic compound is vulnerable to oxygen, a conductive film to be formed following formation of the thin film made of the light-emitting organic compound is desirably formed in such a condition that the thin film made of the light-emitting organic compound is not exposed to surrounding atmosphere containing water and/or oxygen. Accordingly, it can be preferable to form both the thin film made of the light-emitting organic compound and the conductive film to function as a cathode or an anode in the same thin-film formation apparatus.

For meeting the above-mentioned requirement, a thin-film formation apparatus of the multi-chamber type is suitable. In the present invention, it is preferable to form an EL display device having high reliability by utilizing such a thin-film formation apparatus.

With the above-mentioned structure, a current that is caused by reasons other than the carrier recombination can be prevented from flowing through a thin film made of the light-emitting organic compound that is contained in an EL device, and deterioration caused by unnecessary heat generation can be prevented. Accordingly, it is possible to obtain an EL display device with high reliability. Moreover, an electronic apparatus with a highly reliable display portion can be obtained by utilizing such an EL display device as its display portion.

BRIEF DESCRIPTION OF THE DRAWINGS

In the accompanying drawings:

FIGS. 2A through 2E are views for illustrating the fabricating steps of an active matrix type EL display device;

FIGS. 4A through 4C are views for illustrating the fabricating steps of an active matrix type EL display device;

FIG. 10 is a diagram for illustrating the configuration of an apparatus to be used for forming a cathode layer, an EL layer, an anode layer and the like.

DETAILED DESCRIPTION OF THE PREFERRED EMBODIMENTS

Figure 1:
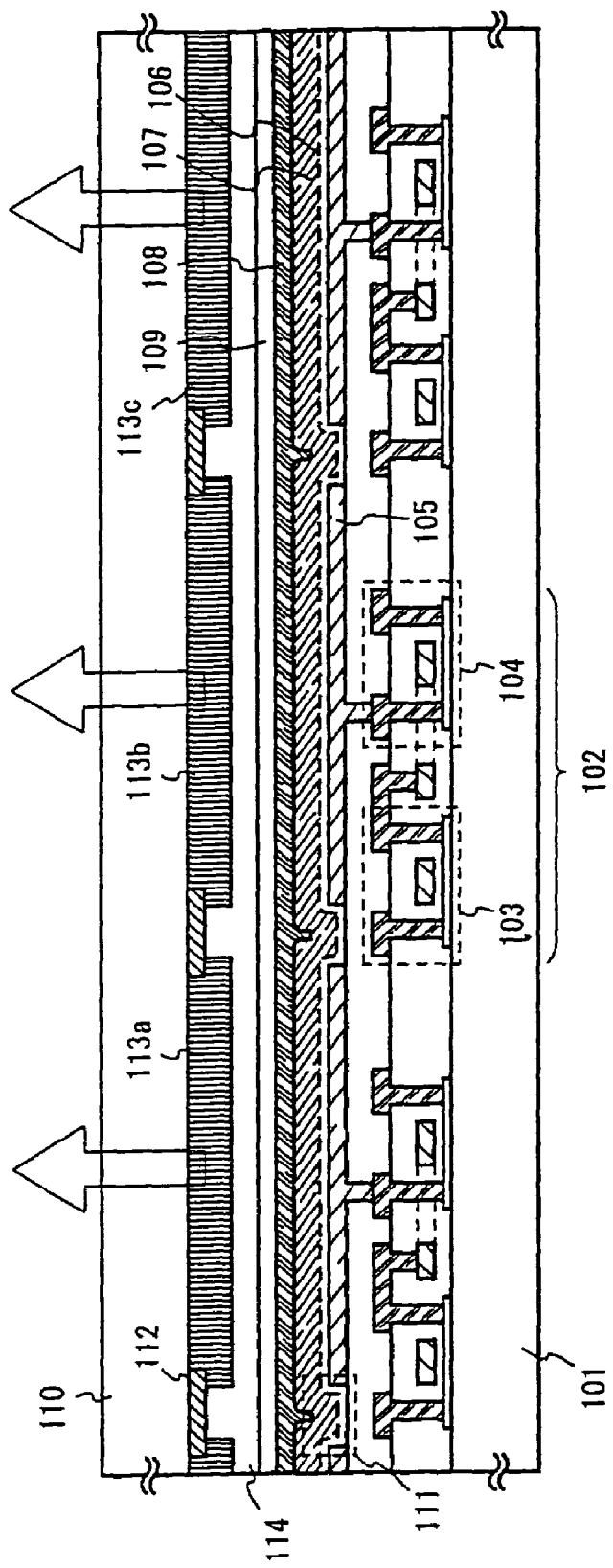
FIG. 1 is a view for illustrating a pixel portion of an EL display device.

One embodiment of the present invention will be described with reference to FIG. 1. In FIG. 1, reference numeral 101 denotes a substrate having an insulating surface. As the substrate 101, an insulating substrate such as a quartz substrate can be used. Alternatively, various kinds of substrate, such as a class substrate, a ceramic substrate, a crystallized glass substrate, a metal substrate (preferably a stainless substrate), or a plastic substrate, can be used by providing an insulating film on a surface thereof.

On the substrate 101, pixels 102 are formed. Although only three of the pixels are illustrated in FIG. 1, a higher number of pixels are actually arranged in matrix. For example, pixels are arranged in a matrix of 640×480 for a VGA class, and in a matrix of 1024×768 for an XGA class. In each of the pixels 102, two TFTs are formed; one of them is a switching TFT 103, and the other is a current-control TFT 104. A drain of the switching TFT 103 is electrically connected to a gate of the current-control TFT 104. Furthermore, a drain of the current-control TFT 104 is electrically connected to a pixel electrode 105 (which in this case, also functions as a cathode of an EL device). The pixel 102 is thus formed.

Respective wirings of the TFT as well as the pixel electrode can be formed of a metal film having a low resistivity. For example, an aluminum alloy film may be used for this purpose. In addition, the TFT can have any structure including a known structure.

Following the fabrication of the pixel electrode 105, a compound 106 (which can be referred to as the cathode layer) that contains a metal having a low work function is formed over all of the pixel electrodes. It should be noted that the outline of the compound 106 is indicated by a dotted line in FIG. 1. This is because the compound 106 has a thickness which is as thin as several nm, and it cannot be clearly known whether the compound 106 is formed as a layer or in an island-shape.

As a material for the above-mentioned compound 106 that contains a metal having a low work function, lithium fluoride (LiF), lithium oxide ($Li_2O$), barium fluoride ($BaF_2$), barium oxide (BaO), calcium fluoride ($CaF_2$), calcium oxide (CaO), strontium oxide (SrO), or cesium oxide ($Cs_2O$) can be used. Since these are insulating materials, short-circuiting between the pixel electrodes does not occur even when the compound 106 is formed as a layer.

It is of course possible to use a known conductive material such as a MgAg electrode instead of the above-mentioned compound 106. However, in this case, the conductive material has to be selectively formed or patterned into a certain shape in order to avoid short-circuiting between the pixel electrodes.

Over the compound 106 that contains a metal having a low work function, an EL layer 107 (a thin film made of a light-emitting organic compound) is formed. Although any known material and/or structure can be employed for the EL layer 107, a material capable of emitting white light is used in the present invention. With respect to the structure of the EL layer, only a light-emitting layer (a thin film made of a light-emitting organic compound) for providing sites for the carrier recombination may be included in the EL layer. Alternatively, if necessary, an electron injection layer, an electron transport layer, a hole transport layer, an electron blocking layer, a hole element layer, or a hole injection layer may be further layered to form the EL layer. In the present specification, all of those layers intended to realize injection, transport or recombination of carriers are collectively referred to as the EL layer.

As a light-emitting organic compound to be used as the EL layer 107, either a low-molecular type organic compound or a polymer type (high-molecular type) organic compound can be used. However, it is desirable to use a polymer type EL compound which can be formed by an formation technique that can be easily performed, such as a spin coating method, a printing method, or the like. The structure illustrated in FIG. 1 is of the color display type in which an EL layer for emitting white light is combined with a color filter. Alternatively, a color display scheme in which an EL layer for emitting blue or blue-green light is combined with fluorescent material (fluorescent color conversion layer; CCM), or another color display scheme in which EL layers respectively corresponding to RGB are overlaid each other to provide a color display, can also be employed.

One of the features of the present invention is that a light-emitting organic compound purified to an extremely high degree of purity is used as a light-emitting layer. As a purification method, any known process for purification can be used. For example, a zone purification method, a sublimation purification method, a recrystallization method, a distillation method, a column chromatography method, or a reprecipitation method can be used for a low-molecular type EL compound. For a high-molecular type EL compound, a dialysis method or a high-performance liquid chromatography method can be used. In the case of the high-molecular type EL compound, it is also possible that a purification process similar to that for the low-molecular type EL compound is performed prior to polymerization, and a compound is then polymerized.

In the case where a high-molecular type EL compound is to be purified by means of a dialysis method, an electrodialysis method is particularly preferred for eliminating ionic impurities.

In the dialysis method, a polymerized high-molecular type EL material is put in a semi-permeable membrane made of a cellulose or the like, and immersed in a solvent, e.g., pure water. The semi-permeable membrane is usually fixed by being supported between fine metal mesh partitions, or by being attached to a porous supporting member such as a circle plate made of half-melt glass. In the electrodialysis method, a voltage is applied between metal mesh partitions supporting the semi-permeable membrane, thereby resulting in a higher moving speed for ionic impurities which can realize efficient purification.

In accordance with the present invention, the above-mentioned purification process is repeated so that the concentration of ionic impurities contained in the thin film made of the light-emitting organic compound reaches a level of 0.1 ppm or lower (preferably, a level of 0.01 ppm or lower). The above-mentioned concentration range of the ionic impurities provides the thin film made of the light-emitting organic compound, which functions as a light-emitting layer, with a volume resistivity in the range of $3\times10^{10}$ Ωcm or larger. A volume resistivity of a thin film made of a light-emitting organic compound in an EL device is set to be in the range of $1\times10^{11}$ to $1\times10^{12}$ cm (preferably, in the range from $1\times10^{12}$ to $1\times10^{13}$ Ωcm). Thus, a current caused by reasons other than the carrier recombination is prevented from flowing.

In the case where the EL layer includes only a light-emitting layer, i.e., only a single layer of a thin film made of the light-emitting organic compound, the light-emitting layer is required to meet conditions in which the concentration of the contained ionic impurities is equal to or lower than 0.1 ppm (preferably, at 0.01 ppm or lower) and the volume resistivity is in the range of $3\times10^{10}$ Ωcm or larger. A volume resistivity of a thin film made of a light-emittinq organic compound in an EL device is set to be in the range from $1\times10^{11}$ to $1\times10^{12}$ Ωcm (preferably, in the range from $1\times10^{12}$ to $1\times10^{13}$ Ωcm).

It is of course critical to prevent ionic impurities from being mixed into the light-emitting organic compound from the surrounding atmosphere during a process step for purifying the light-emitting organic compound which forms the EL layer and a process step for forming a film thereof.

Over the thus formed EL layer 107, a transparent conductive film is formed as an anode 108. As the transparent conductive film, a compound of indium oxide and tin oxide (referred to as ITO), a compound of indium oxide and zinc oxide, tin oxide ($SnO_2$), or zinc oxide (ZnO) can be used.

Over the anode 108, an insulating film as a passivation film 109 is provided. As the passivation film 109, a silicon nitride film or a silicon nitride oxide film (represented as SiOxNy) is preferably used.

The substrate fabricated up to this stage is referred to as an active matrix substrate in the present specification. More specifically, the substrate on which a TFT, a pixel electrode electrically connected to the TFT, and an EL device (a capacitor composed of a cathode, an EL layer, and an anode) utilizing the pixel electrode as the cathode are formed is referred to as the active matrix substrate.

Furthermore, an opposing substrate 110 is attached to the active matrix substrate so that the EL devices are interposed therebetween. The opposing substrate 110 is provided with light-shielding films 112 and color filters 113a to 113c. At this situation, each of the light-shielding films 112 is provided so that a gap 111 formed between the pixel electrodes 105 is unseen from the viewing direction of an observer (i.e., from a direction normal to the opposing substrate). More specifically, each of the light-shielding films 112 is provided to overlap (align with) the periphery of the pixel when viewed from the direction normal to the opposing substrate. This is because this portion is non-emitting portion, and furthermore, electric field becomes complicated at the edge portion of the pixel electrode and thus light cannot be emitted from this portion with a desired luminance or chromaticity.

More specifically, by providing the light-shielding film 112 at the position corresponding to the periphery (edge portion) of the pixel electrode 105 and the gap 111, contour between the pixels can be made clear. It can be also said that in the present invention, the light-shielding film 112 is provided at the position corresponding to the periphery (edge portion) of the pixel because the contour of the pixel electrode corresponds to the contour of the pixel. It should be noted that the position corresponding to the periphery of the pixel refers to the position aligned with the periphery of the pixel when viewed from the aforementioned direction which is normal to the opposing substrate.

Among the color filters 113a to 113c, the color filter 113a is the one for obtaining red light, the color filter 113b is the one for obtaining green light, and the color filter 113c is the one for obtaining blue light. These color filters are formed at positions respectively corresponding to the different pixels 102, and thus, different color of light can be obtained for the respective pixels. In theory, this is the same as the color display scheme in a liquid crystal display device which uses color filters. It should be noted that the position corresponding to the pixel refers to the position aligned with the pixel when viewed from the direction which is normal to the opposing substrate. More specifically, the color filters 113a to 113c are provided so as to overlap the pixels respectively corresponding thereto when viewed from the direction normal to the opposing substrate.

It should be noted that the color filter is a filter for improving the color purity of light which has passed therethrough by extracting light of a specific wavelength. Accordingly, in the case where the light component of the wavelength to be extracted are not many, there may be disadvantages in which the light of that wavelength has an extremely small luminance or a deteriorated color purity. Thus, although no limitation is imposed to an EL layer for emitting white light which can be used in the present invention, it is preferable that the spectrum of the emitted white light includes emission spectrums of red, green and blue light components having purity of as high as possible.

The color filters 113a to 113c, similarly to the light-shielding films 112, can contain a drying agent such as barium oxide. In this case, a resin film containing a drying agent and a pigment of red, green or blue color may be used as a color filter.

It should be noted that although not illustrated herein, the opposing substrate 110 is adhered to the active matrix substrate by means of a sealing agent, so that a space designated with reference numeral 114 is a closed space. The closed space 114 may be filled with inert gas (noble gas or nitrogen gas), or with inert liquid. Alternatively, the closed space 114 may be filled with a transparent adhesive so as to adhere the whole surface of the substrate. Moreover, it is preferable to dispose a drying agent such as barium oxide in the closed space 114. Since the EL layer 107 is very vulnerable to water, it is desirable to prevent water from entering the closed space 114 as much as possible. Furthermore, it is advantageous to fill the closed space 114 with inert liquid containing crown ether or cryptand. Crown ether has an ability to trap sodium by being combined with them, and thus a gettering effect can be expected to be realized.

As the opposing substrate 110, it is necessary to use a transparent substrate so as not to prevent light from traveling. For example, a glass substrate, a quartz substrate, or a plastic substrate is preferably used. In addition, as the light-shielding film 112, a thin film capable of satisfactorily shielding light, e.g., a titanium film, a resin film including a black-colored pigment or carbon, can be used. It is advantageous to use as the light-shielding film 112, a resin containing a drying agent.

In the EL display device having the above-mentioned construction in accordance with the present invention, the thin film made of the light-emitting organic compound contains ionic impurities at the concentration of 0.1 ppm or lower (preferably, at the concentration of 0.01 ppm or lower) and a volume resistivity in the range of $3 \times 10^{10}$ Ωcm or larger. A volume resistivity of a thin film made of a light-emitting organic compound in an EL device is set to be in the range of $1 \times 10^{11}$ to $1 \times 10^{12}$ Ωcm (preferably, in the range from $1 \times 10^{12}$ to $1 \times 10^{13}$ Ωcm). Accordingly, a current caused by reasons other than the carrier recombination can be prevented from flowing through a thin film made of the light-emitting organic compound that is contained in an EL device, and deterioration caused by unnecessary heat generation can be prevented.

Thus, it is possible to obtain an EL display device with high reliability. Moreover, an electronic apparatus with a highly reliable display portion can be obtained by utilizing such an EL display device as its display portion.

In the EL display device in accordance with the present invention, light emitted from the EL device passes through the opposing substrate to be emitted toward observer's eyes. Accordingly, the observer can recognize an image through the opposing substrate. In this situation, one of the features of the EL display device in accordance with the present invention is that the light-shielding film 112 is disposed between the EL device and the observer so as to conceal the gap 111 between the pixel electrodes 105. Thus, the contour between the pixels can be made clear, thereby resulting in an image display with high definition.

Furthermore, the light-shielding films 112 and the color filters 113a to 113c are disposed on the opposing substrate 110, and the opposing substrate 110 also functions as a ceiling material for suppressing deterioration of the EL device. When the light-shielding films 112 and the color filters 113a to 113c are disposed on the active matrix substrate, additional film-formation and patterning steps are required, thereby resulting in a reduced manufacturing yield. By providing the light-shielding films 112 and the color filters 113a to 113c on the opposing substrate, reduction in the manufacturing yield can be suppressed.

Furthermore, the structure in accordance with the present invention, in which the opposing substrate 110 is provided with the light-shielding films 112 and the color filters 113a to 113c and adhered to the active matrix substrate by means of the sealing agent, has features common to the structure of a liquid crystal display device. Accordingly, it is possible to fabricate the EL display device of the present invention with most of an existing manufacturing line for liquid crystal display devices. Thus, an amount of equipment investment can be significantly reduced, thereby resulting in a reduction in the total manufacturing cost.

Embodiment 1

A first embodiment of the invention is described here. A description will be made here on a method for fabricating TFTs of a pixel portion and driving circuit portions provided around the same simultaneously. For simplicity of the description, only a CMOS circuit is shown which is a basic circuit for such driving circuits.

First, as shown in FIG. 2A, an base film 301 having a thickness of 300 nm is formed on a glass substrate 300. In the present embodiment, the a silicon oxinitride film is laminated as the base film 302. At this time, the density of nitrogen in the region in contact with the glass substrate 300 is preferably in the range from 10 to 25 wt %.

Next, an amorphous silicon film (not shown) having a thickness of 50 nm is formed on the base film 301 using a known film forming method. The film is not limited to an amorphous silicon film, and it may be any semiconductor film (and any microcrystalline semiconductor film) including an amorphous structure. The film may alternatively be a compound semiconductor film including an amorphous structure such as an amorphous silicon germanium film. The thickness may be in the range from 20 to 100 nm.

The amorphous silicon film is then crystallized using known techniques to form a crystalline silicon film (also referred to "polycrystalline silicon film or polysilicon film") 302. Known methods for crystallization include thermal crystallization utilizing an electrically heated furnace, laser anneal crystallization utilizing laser light and lamp anneal crystallization utilizing infrared light. In the present embodiment, crystallization is performed using excimer laser light utilizing XeCl gas. While pulse-oscillated excimer laser light formed in a linear configuration is used in the present embodiment, a rectangular configuration may alternatively be used. Continuously oscillated argon laser light or continuously oscillated excimer laser light may be used.

When Nd-YAG laser (wavelength 1.06 μm) is used, second harmonic or third harmonic is used and the illumination with a beam is carried out to crystallize the above mentioned semiconductor film with 100 to 500 J/cm² energy density. The beam is formed in a linear or rectangular configuration by the optical light system.

In this embodiment, although the crystalline silicon film is used as the active layer of the TFT, it is also possible to use an amorphous silicon film. Note that it is possible to form the active layer of the switching TFT, in which there is a necessity to reduce the off current, by the amorphous silicon film, and to form the active layer of the current control TFT by the crystalline silicon film. Electric current flows with difficulty in the amorphous silicon film because the carrier mobility is low, and the off current does not easily flow. In other words, the most can be made of the advantages of both the amorphous silicon film, through which current does not flow easily, and the crystalline silicon film, through which current easily flows.

Then, as shown in FIG. 2B, a protective film 303 constituted by a silicon oxide film is formed to a thickness of 130 nm on the crystalline silicon film 302. A thickness within the range from 100 to 200 nm (preferably from 130 to 170 nm) may be chosen. Other types of insulation films may be used as long as silicon is included therein. The protective film 303 is provided to prevent direct exposure of the crystalline silicon film to plasma during doping with an impurity and to enable delicate density control.

Resist masks 304a through 304b are formed on the protective film to allow doping with an impurity element that provides n-type conductivity (hereinafter referred to as "n-type impurity element") through the protective film 303. As the n-type impurity element, an element belonging to the group XV, typically, phosphorous or arsenic may be used. In the present embodiment, phosphorous is added in a density of $1\times10^{18}$ atoms/cm$^3$ using a plasma doping process in which phosphine (PH$_3$) is plasma-excited without performing mass separation on the same. It is obviously possible to use an ion implantation process which involves mass separation. The dose is adjusted such that n-type impurity regions 305 and 306 formed at this step include the n-type impurity element in a density in the range from $2\times10^{16}$ to $5\times10^{19}$ atoms/cm$^3$ (typically, from $5\times10^{17}$ to $5\times10^{18}$ atoms/cm$^3$).

Next, as shown in FIG. 2C, the protective film 303 is removed to activate the added element belonging to the group XV. While any known technique may be used as means for activation, activation is carried out by means of illumination with excimer laser light. Obviously, the invention is not limited to excimer laser light, and pulse-oscillated or continuously oscillated laser light may be used. Since the purpose is to activate the added impurity element, illumination is preferably carried out with an energy at which the crystalline silicon film is not melted. The illumination with laser light may be carried out with the protective film 303 unremoved.

When the impurity element is activated with laser light, activation may be simultaneously performed using furnace annealing. Referring to activation using furnace annealing, a thermal process at a temperature in the range from 450 to 550° C.

As a result of this step, the edges of the n-type impurity regions 305 and 306, i.e., the boundaries (bonding portions) between the n-type impurity regions 305 and 306 and the regions around the same which are not doped with the n-type impurity element becomes clear. Therefore, very preferable bonding portions can be formed between the LDD regions and the channel forming region when the TFT is completed later.

Next, as shown in FIG. 2D, unnecessary portions of the crystalline silicon film are removed to form island-shaped semiconductor films (hereinafter referred to as "active layers") 307 through 310. Next, as shown in FIG. 2E, a gate insulation film 311 is formed to cover the active layers 307 through 310. An insulation film including silicon with a thickness in the range from 10 to 200 nm (preferably in the range from 50 to 150 nm) may be used as the gate insulation film 311. This film may have either of single-layer or multi-layer structures. In the present embodiment, a 110 nm thick silicon oxinitride film is used.

Next, a conductive film having a thickness of 200 to 400 nm is formed, and patterning is carried out to form gate electrodes 312 to 316. The end portions of the gate electrodes 312 to 316 can also be made taper-shaped. Note that in this embodiment, the gate electrode and an extended wiring line (hereinafter referred to as a gate wiring line) electrically connected to the gate electrode are formed of different materials. Specifically, a material having a resistance lower than the gate electrode is used for the gate wiring line. This is because a material which can be finely worked is used for the gate electrode and a material which has a low wiring resistance though fine working can not be made is used for the gate wiring line. Of course, the gate electrode and the gate wiring line may be formed of the same material.

While the gate electrode may be constituted by single-layer conductive films, multi-layer films such as double-layer or triple-layer structures are preferably used as needed. Any known conductive film may be used as the material for the gate electrodes. However, as described above, it is preferable to use a material which can be finely worked, specifically, can be patterned into a line width of 2 μm or less. Specifically, it is possible to use thin films including tantalum (Ta), titanium (Ti), molybdenum (Mo), tungsten (W), chromium (Cr) or conductive silicon (Si) or thin films which are nitrides of the same (typically tantalum nitride films, tungsten nitride films or titanium nitride films) or alloy films which are combinations of the above elements (typically Mo—W alloys or Mo—Ta alloys) or silicide films including the above elements (typically tungsten silicide films or titanium silicide films). Such films may be used in either of single-layer and multi-layer structures.

In the present embodiment, multi-layer films formed by a 50 nm thick tantalum nitride (WN) film and 350 nm thick tungsten (W) film are used. They may be formed using a sputtering process. An inert gas such as Xe, Ne or the like may be used as the sputtering gas to prevent the films from coming off due to stress.

At this time, the gate electrodes 313 and 316 are formed such that they overlap a part of the n-type impurity regions 305 and 306 respectively with the gate insulation film 311 interposed. Such overlaps become LDD regions which overlap the gate electrodes later.

Figure 3A:
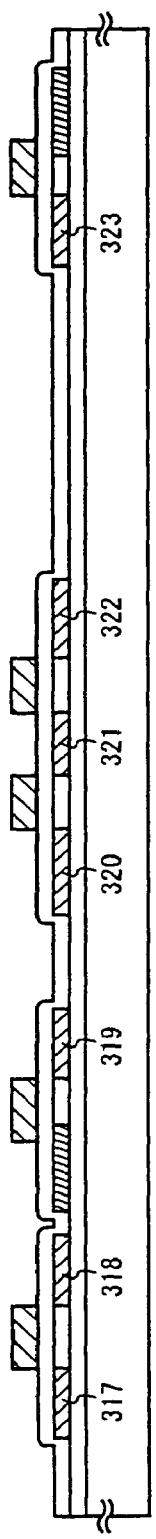
FIGS. 3A through 3D are views for illustrating the fabricating steps of an active matrix type EL display device.

Next, as shown in FIG. 3A, an n-type impurity element (which is phosphorous in the present embodiment) is added in a self-aligning manner using the gate electrodes 312 through 316 as masks. An adjustment is performed such that resultant impurity regions 317 through 323 are doped with phosphorous in a density in the range from 1/2 to 1/10 (typically from 1/3 to 1/4) of that in the n-type impurity regions 305 and 306. Specifically, a density in the range from $1\times10^{16}$ to $5\times10^{18}$ atoms/cm$^3$ (typically from $3\times10^{17}$ to $3\times10^{18}$ atoms/cm$^3$ is preferable.

Figure 3B:
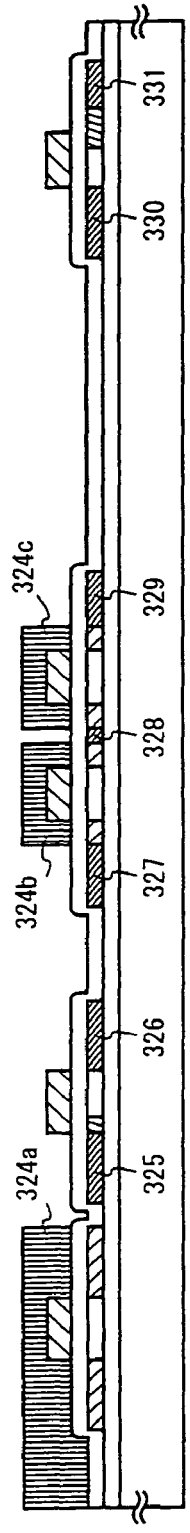

Next, as shown in FIG. 3B, resist masks 324a through 324c are formed to cover the gate electrodes and the like, and an n-type impurity element (which is phosphorous in the present embodiment) is added to form impurity regions 325 through 331 heavily doped with phosphorous. An ion doping process utilizing phosphine (PH$_3$) is performed again, and the density of phosphorous in those regions is adjusted such that it is within the range from $1\times10^{20}$ to $1\times10^{21}$ atoms/cm$^3$ (typically from $2\times10^{20}$ to $5\times10^{21}$ atoms/cm$^3$).

While this step forms the source regions or drain regions of the n-channel type TFTs, a part of the n-type impurity regions 320 through 322 formed at the step shown in FIG. 3A is left for the switching TFT.

Figure 3C:
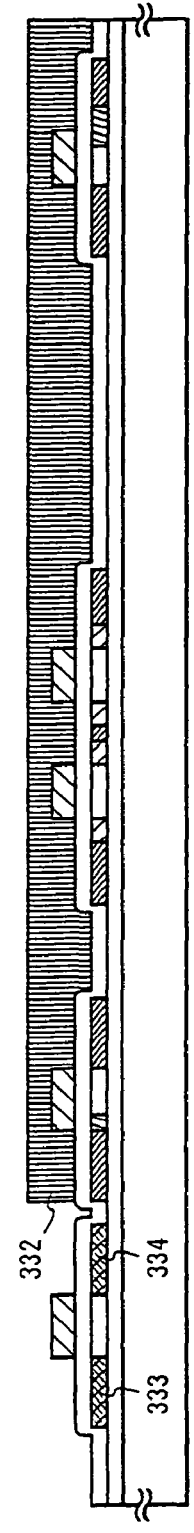

Next, as shown in FIG. 3C, the resist masks 324a through 324c are removed to form a new resist mask 332. A p-type impurity element (which is boron in the present embodiment) is added to form impurity regions 333 and 334 heavily doped with boron. An ion doping process utilizing diborane (B$_2$H$_6$) is performed here to add boron in a density within the range from $3\times10^{20}$ to $3\times10^{21}$ atoms/cm$^3$ (typically from $5\times10^{20}$ to $1\times10^{21}$ atoms/cm$^3$).

While the impurity regions 333 and 334 have already been doped with phosphorous in a density within the range from $1\times10^{20}$ to $1\times10^{21}$ atoms/cm$^3$, boron is added here in a density which is at least three times the same density. As a result, the previously formed n-type impurity regions are completely inverted into the p-type to serve as p-type impurity regions.

The n-type or p-type impurity element added in the respective density is activated after removing the resist mask 332.

The means for annealing may be furnace annealing, laser annealing or lamp annealing. In the present embodiment, a thermal process at 550° C. is performed for four hours in a nitrogen atmosphere in an electrically heated furnace.

At this time, it is critical to eliminate oxygen from the surrounding atmosphere to a level of as low as possible. This is because when oxygen of even only a small amount exists, an exposed surface of the gate electrode is oxidized, which results in an increased resistance and later makes it difficult to form an ohmic contact with the gate electrode. Accordingly, the oxygen concentration in the surrounding atmosphere for the above-mentioned activation process is set at 1 ppm or lower, preferably at 0.1 ppm or lower.

Figure 3D:
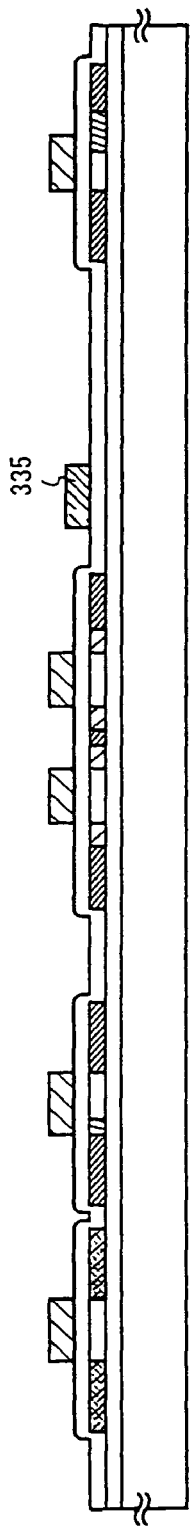

After the activation process is completed, the gate wiring 335 having a thickness of 300 nm is formed. As a material for the gate wiring 335, a metal film containing aluminum (Al) or copper (Cu) as its main component (occupied 50 to 100% in the composition) can be used. The gate wiring 335 is arranged so as to provide electrical connection for the gate electrodes 314 and 315 of the switching TFT (see FIG. 3D).

The above-described structure can allow the wiring resistance of the gate wiring to be significantly reduced, and therefore, an image display region (pixel portion) with a large area can be formed. More specifically, the pixel structure in accordance with the present embodiment is advantageous for realizing an EL display device having a display screen with a diagonal size of 10 inches or larger (or 30 inches or larger).

Thereafter, a first interlayer insulating film 336 is formed, as shown in FIG. 4A. As the first insulating film 336, a single-layered insulating film containing silicon, or a layered film obtained through combination thereof, can be used. A thickness of the first insulating film 336 can be set in the range from 400 nm to 1.5 µm. In the present embodiment, the first interlayer insulating film 336 is formed to have a layered structure in which a silicon oxide film having thickness of 800 nm is formed on a silicon nitride oxide film having a thickness of 200 nm.

Furthermore, a heat treatment is performed in the atmosphere containing hydrogen of 3 to 100% at a temperature of 300 to 450° C. for 1 to 12 hours so as to realize a hydrogenation treatment. In this treatment, dangling bonds in the semiconductor film are terminated with thermally excited hydrogens. As other processes for hydrogenation, a plasma hydrogenation process can be performed in which hydrogens generated by plasma are used. It should be noted that the hydrogenation process may be performed during the formation of the first interlayer insulating film 336. More specifically, the above-mentioned hydrogenation process can be performed after forming a silicon nitride oxide film having a thickness of 200 nm, followed by the formation of the remaining 800 nm portion of the silicon oxide film.

Then, contact holes are formed through the first interlayer insulating film 336, and source wirings 337 to 340 and drain wirings 341 to 343 are then formed. In the present embodiment, the electrode is formed as a layered film with a three-layered structure, including a 100 nm thick Ti film, a 300 nm thick Al film containing Ti, and a 150 nm thick Ti film, that are continuously formed by a sputtering method. Other conductive films can be of course used.

Thereafter, a first passivation film 344 having a thickness in the range of 50 to 500 nm (typically, in the range of 200 to 300 nm) is formed. In the present embodiment, a silicon nitride oxide film having a thickness of 300 nm is used as the first passivation film 344. Alternatively, a silicon nitride film may be instead used.

It is advantageous to perform a plasma treatment with a gas containing hydrogens such as $H_2$, $NH_3$, prior to the formation of the silicon nitride oxide film. Hydrogens excited in the pre-process are supplied to the first interlayer insulating film 336. By performing the heat treatment in such a situation, the film properties of the first passivation film 344 are improved. Simultaneously, the hydrogens added to the first interlayer insulating film 336 are diffused downwards, thereby resulting in efficient hydrogenation of the active layer.

Then, a second interlayer insulating film 345 made of an organic resin is formed, as shown in FIG. 4B. As the organic resin, polyimide, polyamide, acrylic, BCB (benzocyclobutene) or the like can be used. The second interlayer insulating film 345 is provided mainly for planarization, and thus, acrylic capable of exhibiting satisfactory planarizing properties is preferred. In the present embodiment, an acrylic film is formed so as to have a thickness sufficient for realizing the planarization of steps formed by the TFTs. Preferably, the acrylic film has a thickness in the range of 1 to 5 µm (more preferably, in the range of 2 to 4 µm).

Thereafter, a contact hole is formed in the second interlayer insulating film 345 and the first passivation film 344 to reach the drain wiring 343, and then the pixel electrode 346 is formed. In the present embodiment, an aluminum alloy film (an aluminum film containing titanium of 1 wt %) having a thickness of 300 nm is formed as the pixel electrode 346. Reference numeral 347 denotes an end portion of the adjacent pixel electrode.

Figure 10:
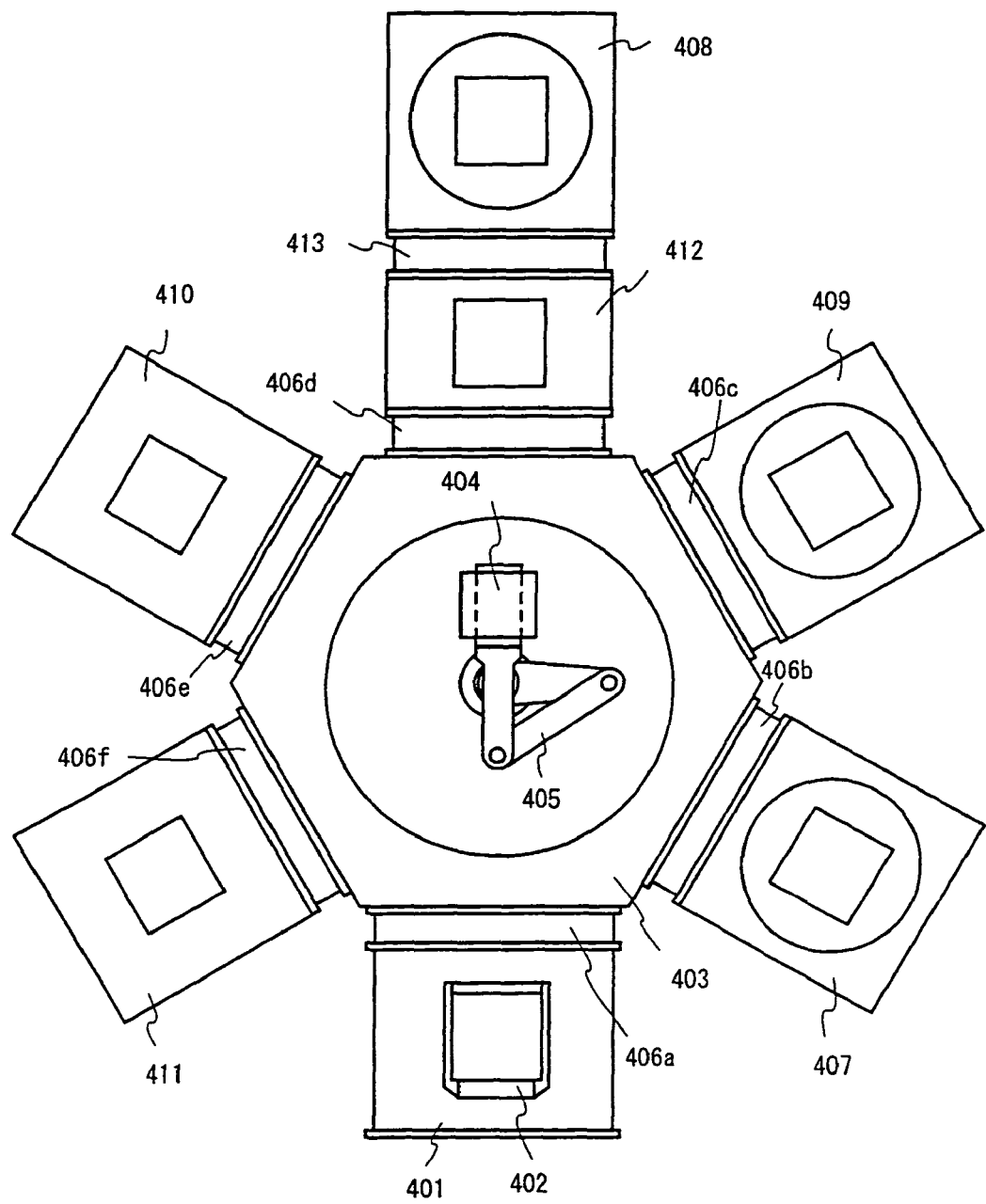

FIG. 10 illustrates a thin-film formation apparatus to be used for continuously forming the EL layer and the anode layer. More specifically, FIG. 10 illustrates an apparatus to be used for continuously forming a transparent conductive film as the anode layer, a high-molecular type EL layer as the light-emitting layer, a metal film containing an element belonging to Group I or II in the periodic table as the cathode layer, and a silicon nitride film or a silicon nitride oxide film as the second passivation layer.

In FIG. 10, reference numeral 401 denotes a transportation chamber in which transportation of a substrate into and out of the apparatus is performed. The transportation chamber is also referred to as a load/unload chamber. A carrier 402 to which the substrate is mounted is placed in the transportation chamber 401. Two of the transportation chambers 401 may be provided; one of them is used for transporting the substrate into the apparatus, while the other is for transporting the substrate out of the apparatus. Reference numeral 403 denotes a common chamber provided with a mechanism 405 for transporting the substrate 404 (hereinafter referred to as the transportation mechanism). The transportation mechanism 405 includes a robot arm or the like for handling a substrate.

A plurality of process chambers (designated as 407 to 411, respectively) are coupled to the common chamber 403 via gates 406a to 406f. In the configuration shown in FIG. 10, the pressure in the common chamber 403 is reduced to several mTorrs to several tens of mTorrs, and the respective process chambers are decoupled from the common chamber 403 by means of the gates 406a to 406f. In this case, the process chamber 408 for solution application process is filled with inert gas so that the process is to be performed under a normal pressure. Accordingly, a process chamber 401 for vacuum evacuation is provided between the common chamber 403 and the process chamber 408 for solution application process.

Accordingly, when the respective chambers are provided with an evacuation pump, respective processes can be performed in vacuum. As an evacuation pump, an oil rotation pump, a mechanical booster pump, a turbo molecular pump, or a cryopump can be used, and in particular, the cryopump is preferred since it is effective for eliminating water.

Further by referring to FIG. 10, reference numeral 407 denotes a process chamber for forming the cathode layer (hereinafter referred to as the third film-formation process chamber). In this chamber 407, an auxiliary electrode for assisting the cathode is formed. A vapor deposition method or a sputtering method is usually used, and among them, the vapor deposition method is more preferred since it introduces less damage to a substrate to be processed. In either case, the third film-formation process chamber 407 is decoupled from the common chamber 403 by the gate 406b so that the film formation process can be performed in vacuum.

On the other hand, in the case where the vapor deposition method is performed as a vapor-phase film-formation method, a vapor source has to be provided. A metal film to be often used as the cathode layer is made of an element belonging to Group I or II in the periodic table. However, this kind of metal film is likely to be oxidized, and therefore, it is desirable to protect a surface thereof. In addition, the required film thickness therefor is small. Thus, a conductive film having a low resistivity is auxiliarily provided to reduce a resistance value of the cathode as well as to protect the cathode. As the conductive film having a low resistivity, a metal film containing aluminum, copper or silver as its main component can be used. In the present embodiment, lithium fluoride is used for an electron injection layer 348 shown in FIG. 4C, and the electron injection layer 348 is formed by a vacuum vapor deposition method to have a thickness of 5 nm.

By further referring to FIG. 10, reference numeral 408 denotes a process chamber for applying a solution containing the high-molecular type EL material by a spin coating method (hereinafter referred to as the solution application process chamber). As set forth above, since the EL material is very vulnerable against water, the solution application process chamber 408 is required to be always held in inert atmosphere.

For transportation of a substrate, the pressure in the vacuum evacuation process chamber 412 is reduced to the same level as the common chamber 403. Thereafter, the gate 406d is opened under that condition, and a substrate is transported. The gate 406d is then closed, and the vacuum evacuation process chamber 412 is purged by inert gas to a normal pressure. Then, the gate 413 is opened at the time when the pressure returns to the normal level, and the substrate is transported to the solution application process chamber 408. This transportation may be performed for every stage. Alternatively, the transportation may be performed by means of specially-dedicated transportation means.

The solution application process chamber 408 is provided with a fixed head for holding and rotating the substrate, and means for supplying a solvent containing a high-molecular type EL compound onto the substrate by an appropriate amount. The fixed head can be of the vacuum chuck type which has a simple configuration. However, the substrate may be deformed in a pattern corresponding to a shape of a suction port, resulting in a deviation in a thickness of the resultant EL layer. While the EL layer is to be formed to have a thickness in the range of 100 to 200 nm, the deviation of the film thickness thereof is likely to lead to deteriorated display quality in which, e.g., the intensity of light emission is varied.

FIGS. 11A through 11F respectively illustrate various configurations of the fixed head to be used for reducing such a deviation in the film thickness to the minimum level. The suction port has a shape in which concentric grooves or a plurality of openings are provided. Evacuation to vacuum is performed through a coupling port provided beneath the suction port so that a suction force is scattered two-dimensionally. The fixed head with such a configuration is integrated with upper and lower plates.

Figure 11A:
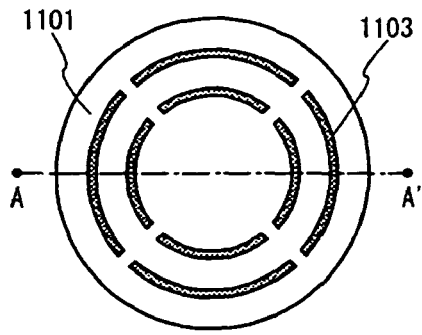
FIGS. 11A through 11F are views for respectively illustrating suitable shapes of a substrate fixing head to be used in a spin coating method.
Figure 11B:
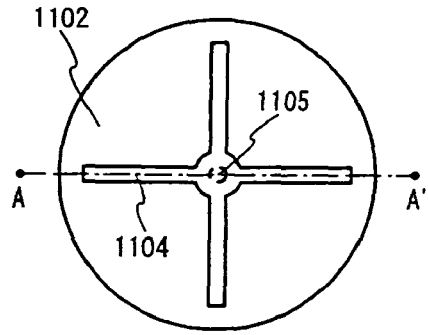
Figure 11C:
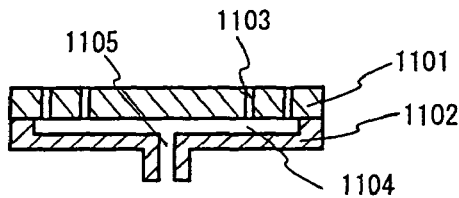
Figure 11D:
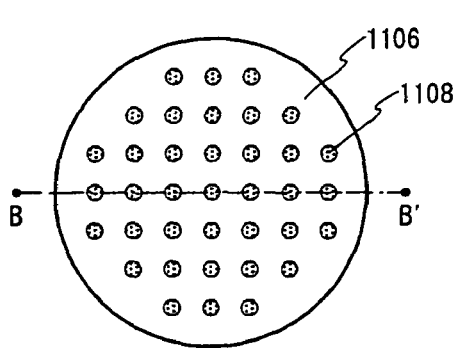
Figure 11E:
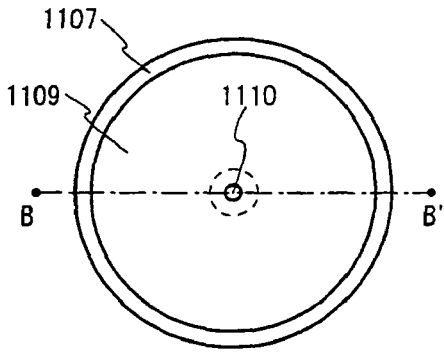
Figure 11F:
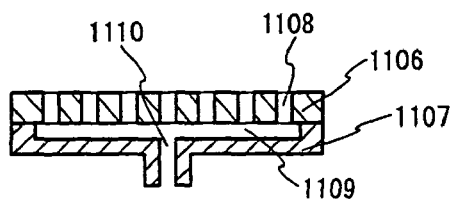

More specifically, FIG. 11A illustrates a top view of an upper plate 1101 of the fixed head, and a plurality of openings 1103 are formed in concentric patterns. FIG. 11B illustrates a lower plate 1102 provided with an evacuation port 1105 combined with a cross-shaped common groove 1104. FIG. 11C illustrates a cross-sectional view taken along line A-A' in FIGS. 11A and 11B in which the upper plate 1101 is overlaid the lower plate 1102. FIG. 11D illustrates another example in which a plurality of openings 1108 are provided in an upper plate 1106 of the fixed head. FIG. 11E illustrates a lower plate 1107 provided with an evacuation port 1110 combined with a circular-shaped common groove 1109. FIG. 11F illustrates a cross-sectional view taken along line B-B' in FIGS. 11D and 11E in which the upper plate 1106 is overlaid the lower plate 1107.

In the present embodiment, PVK (polyvinylcarbazole), Bu-PBD (2-(4'-tert-butyl phenyl)-5-(4"-biphenyl)-1,3,4-oxydiazole), coumarin6, DCM1 (4-dicyanomethylene-2-methyl-6-p-dimethylaminostyryl-4H-pyran), TPB (tetraphenyl butadiene), or Nile Red is dissolved into 1,2-dichloromethane or chloroform, and the resultant solution is applied by a spin coating method. The number of revolutions is set in the range from about 500 to 1000 rpm, and the spinning continues for 20 to 60 seconds to obtain an uniformly applied film.

It should be noted that prior to the film formation of the above-mentioned organic compound, the purification process (typically, the dialysis method) is repeated at least three times or more, preferably five times or more, so that the concentration of the ionic impurities contained therein is reduced to 0.1 ppm or lower (preferably 0.01 ppm or lower). Thus, the concentration of the ionic impurities contained in the light-emitting layer 349 shown in FIG. 4C is reduced to 0.1 ppm or lower (preferably to 0.01 ppm or lower) and a volume resistivity of the light-emitting layer 349 is set in the range of $3\times10^{10}$ Ωcm or larger. A volume resistivity of a thin film made of a light-emitting organic compound in an EL device is set to be in the range of $1\times10^{11}$ to $1\times10^{12}$ Ωcm (preferably, in the range from $1\times10^{12}$ to $1\times10^{13}$ Ωcm).

After completion of the solution application process, the gate 413 is opened and the substrate 412 is transported to the vacuum evacuation process chamber 412. After the gates 413 and 406d are closed, vacuum evacuation is performed in such a condition. When the pressure in the vacuum evacuation process chamber 412 reaches the same reduced pressure condition as the common chamber 403, the gate 406d is opened so that the substrate is transported into the common chamber.

Although a baking process chamber 409 is provided in the illustrated configuration, it is possible to provide the vacuum evacuation process chamber 412 with a susceptor that can be heated so that a baking process can be performed in the vacuum evacuation process chamber 412. When the baking process is followed by vacuum evacuation, degassing can be prevented.

With further reference to FIG. 10, reference numeral 410 denotes a process chamber for forming the anode layer 350 (hereinafter referred to as the first film-formation process chamber). The vapor deposition method or the sputtering method can be preferably performed for the film formation in this case. It should be noted that since the process is used for forming the anode layer on the light-emitting layer 349, the process is required not to damage the light-emitting layer 349. In the case where the sputtering method is performed, a target made of the materials as set forth above, such as ITO, a compound of indium oxide and zinc oxide, SnO$_2$, or ZnO, is used. The film is formed to have a thickness of 30 to 300 nm.

Upon the film formation by the sputtering method, a surface on which the film is to be formed (i.e., the surface with the light-emitting layer formed thereon) may face upward (face-up type) or downward (face-down type). In the case of the face-up type, the substrate transported from the common chamber 403 can be mounted onto the susceptor without being required to change its orientation, thereby resulting in a simplified operation. On the other hand, in the case of the face-down type, the transportation mechanism 405 or the first vapor-phase film-formation process chamber 410 is required to be provided with a certain mechanism for turning the substrate upside down, thereby resulting in a complicated transportation mechanism. However, the face-down type has an advantage in which a less amount of dust is attached to the substrate.

In the case where the vapor deposition process is performed in the first film-formation process chamber 410, a vapor source is required to be provided therein. A plurality of vapor sources may be provided. It should be also noted that a vapor source may be of the resistive-heating type or of the EB (electron beam) type.

With reference again to FIG. 10, reference numeral 411 denotes a process chamber for forming the second passivation film (hereinafter referred to as the second film-formation process chamber). As the second passivation film, a silicon nitride film or a silicon nitride oxide film is formed by a plasma CVD method. Accordingly, although not illustrated, a gas supply system for SiH$_4$, N$_2$O, NH$_3$ or the like, plasma generating means utilizing an RF power source of 13.56 to 60 MHz, as well as substrate heating means are provided for the second film-formation process chamber. Since the EL layer is vulnerable to water or moisture, it is preferable to form such a passivation film continuously after forming the EL layer without allowing the EL layer to be exposed to the surrounding atmosphere.

In the present embodiment, the layered structure including the electron injection layer 348 and the light-emitting layer 349 as shown in FIG. 4C is used as the EL layer. Alternatively, an electron transport layer, a hole transport layer, a hole injection layer, an electron blocking layer, or a hole blocking layer can be further formed in the EL layer, if necessary.

The second passivation film 351 made of a silicon nitride film is formed by a plasma CVD method to have a thickness of 100 nm. This second passivation film 351 is intended to provide protection for the light-emitting layer 349 against water or the like, and also function to release heat generated in the light-emitting layer 349. In order to further enhance the heat radiation effect, it is advantageous to form the second passivation film by forming a silicon nitride film and a carbon film (preferably a diamond-like carbon film) into the layered structure.

Thus, the active matrix type EL display device having the configuration as shown in FIG. 4C is completed. The active matrix type EL display device in accordance with the present embodiment is provided with TFTs having appropriate structures not only in a pixel portion but also in a driver circuit portion. Accordingly, the EL display device can exhibit high reliability and improved operational characteristics.

As an n-channel TFT 205 in a CMOS circuit to be used for the driver circuit, a TFT having the structure suitable for reducing the injection of hot carriers so as not to decrease an operation speed is used. The driver circuit mentioned here includes a shift register, a buffer, a level shifter, a sampling circuit (sampling and holding circuit) or the like. A signal conversion circuit such as a D/A converter is also included therein for a digital driving.

In the present embodiment, as shown in FIG. 4C, an active layer of the n-channel TFT 205 includes a source region 355, a drain region 356, an LDD region 357, and a channel-forming region 358, wherein the LDD region 357 overlaps a gate electrode 313 via a gate insulating film 311 interposed therebetween.

The LDD region is provided only on the side closer to the drain region so as to prevent an operation speed from decreasing. An OFF current value does not have a significant adverse effect in the case of the n-channel TFT 205. Rather, it is more preferable to place an emphasis upon the operation speed. Accordingly, it is desirable to dispose the LDD region 357 so as to completely overlap the gate electrode thereby resulting in a reduced resistance value. In other words, it is desirable that the LDD region is not offset with respect to the gate electrode.

Furthermore, deterioration of a p-channel TFT 206 in the CMOS circuit due to the injection of hot carriers is almost negligible, and thus, it is not necessary to provide any LDD region for the p-channel TFT 206. It is of course possible to provide the LDD region for the p-channel TFT 206, similarly for the n-channel TFT 205, to exhibit countermeasure against the hot carriers.

In the actual process, after the structure shown in FIG. 4C is completed, the EL layer is sealed in the closed space by using the opposing substrate provided with the light-shielding films, as previously described with reference to FIG. 1. At this time, the reliability (lifetime) of the EL layer can be improved by setting an inert atmosphere within the closed space or disposing a moisture absorbing material (e.g., barium oxide) in the closed space. Such a sealing process of the EL layer can be performed by using the technique to be used in the cell assembly step for liquid crystal display devices.

After the sealing process of the EL layer is completed, a connector (flexible print circuit; FPC) is attached for connecting the terminals extended from the elements or circuits formed on the substrate to external signal terminals, thereby completing a final product.

Figure 5:
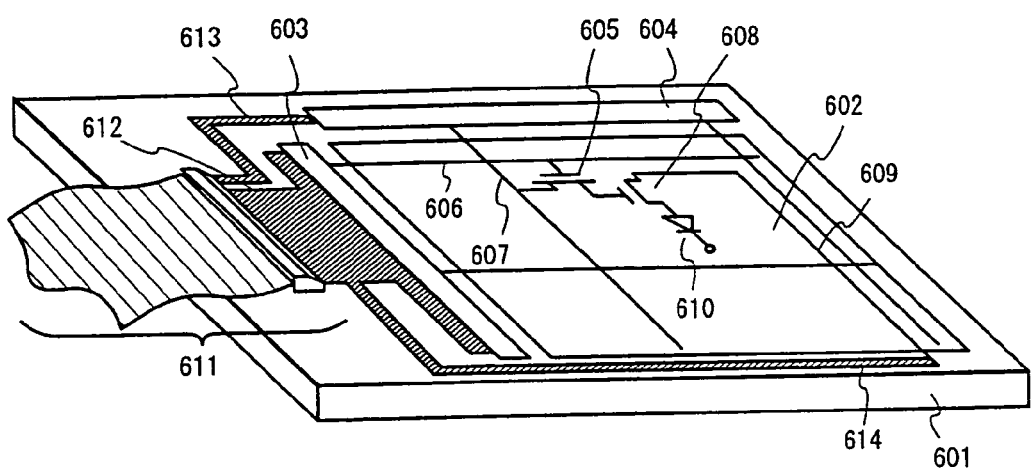
FIG. 5 is a perspective view for illustrating the appearance of an EL display device.

With now reference to the perspective view of FIG. 5, the structure of the active matrix type EL display device in accordance with the present embodiment will be described. The active matrix type EL display device of the present embodiment includes a pixel portion 602, a gate driver circuit 603, and a source driver circuit 604 provided on a glass substrate 601. Switching TFTs 605 in the pixel portion is of the n-channel, and are respectively disposed at crossing points between gate wirings 606 connected to the gate driver circuit 603 and source wirings 607 connected to the source driver circuit 604. A drain of each of the switching TFTs 605 is connected to a gate of the corresponding current-control TFT 608.

Furthermore, a source of each of the current-control TFTs 608 is connected to a power supply line 609. In the structure in accordance with the present embodiment, the power supply line 609 is provided with a predetermined voltage. In addition, the EL device 610 is connected to a drain of the corresponding current-control TFT 608. Since a cathode of the EL device 610 is connected to the drain of the current-control TFT 608, it is desirable to use an n-channel TFT as the current-control TFT 608.

The FPC 611 functioning as external input/output terminals is coupled with connection wirings 612 and 613 for transmitting signals to the driver circuits, and a connection wiring 614 that is in turn connected to the power supply line 609.

Figure 6A:
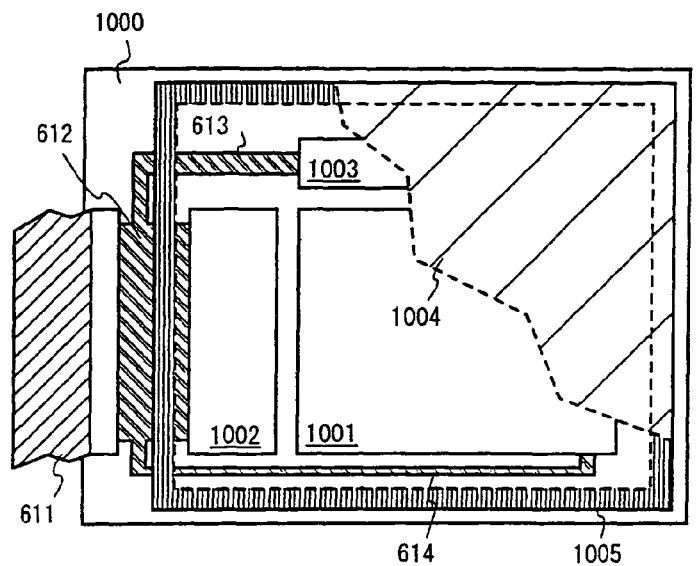
FIG. 6A is a top view for illustrating the appearance of the EL display device.

Furthermore, the EL display device in accordance with the present embodiment will be described with reference to FIGS. 6A and 6B. A substrate 1000 is an active matrix substrate. On the substrate, a pixel portion 1001, a source driver circuit 1002, and a gate driver circuit 1003 are formed. Various wirings from the respective driver circuits are extended via connection wirings 612 to 614 to reach the FPC 611 and be connected to an external device.

At this time, an opposing substrate 1004 is provided so as to surround at least the pixel portion, and more preferably, both the driver circuits and the pixel portion. The opposing substrate 1004 is adhered to the active matrix substrate 1000 by means of an adhesive (sealing agent) 1005 to form a closed space 1006 in cooperation with the active matrix substrate 1000. Thus, the EL device is completely sealed in the closed space 1006 and shut out from the external air.

In the present embodiment, a photocurable epoxy-type resin is used as the adhesive 1005. Alternatively, other adhesives such as an acrylate type resin can be also used. A thermosetting resin can be also used if acceptable in view of heat-resistance characteristics of the EL layer. It should be noted that the material is required to prevent oxygen and water from passing therethrough as perfectly as possible. The adhesive 1005 may be applied by a coating device such as a dispenser.

Furthermore, in the present embodiment, the closed space 1006 between the opposing substrate 1004 and the active matrix substrate 1000 is filed with nitrogen gas. Moreover, the opposing substrate 1004 is provided on its inner side (on the side closer to the closed space) with a light-shielding film 1007 and a color filter 1008, as described previously with reference to FIG. 1. In the present embodiment, a resin film containing barium oxide and a black-colored pigment is used as the light-shielding film 1007, and a resin film containing a red-colored, green-colored, or blue-colored pigment can be used as the color filter 1008.

Figure 6B:
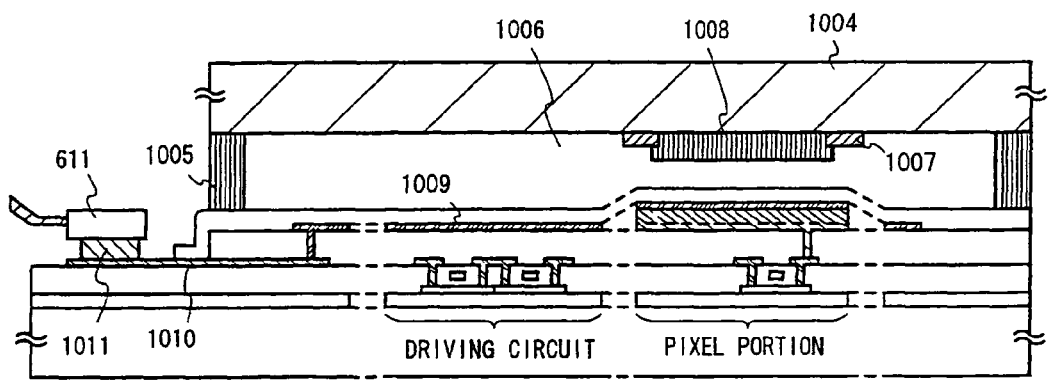
FIG. 6B is a cross-sectional view for illustrating the structure of the EL display device.

Furthermore, as shown in FIG. 6B, the pixel portion is provided with a plurality of pixels each including an individually separated EL device. All of these El devices share an anode 1009 as a common electrode. The EL layer may be provided only in the pixel portion, but is not required to be disposed over the driver circuits. In order to selectively provide the EL layer, a vapor deposition method employing a shadow mask, a lift-off method, a dry etching method, or a laser scribing method can be used.

The anode 1009 is electrically connected to a connection wiring 1010. The connection wiring 1010 is a power supply line to be used for supplying a predetermined voltage to the anode 1009, and is electrically connected to the FPC 611 via a conductive paste material 1011. Although only the connection wiring 1010 is described herein, the other connection wirings 612 to 614 are also electrically connected to the FPC 611 in the similar manner.

As described above, the structure as shown in FIGS. 6A and 6B can display an image on its pixel portion by connecting the FPC 611 to terminals of an external device. In the present specification, the EL display device is defined as a module containing a product in which it becomes possible to display an image when an FPC is attached thereto, in other words, a product obtained by attaching an active matrix substrate to an opposing substrate (including the one provided with an FPC attached thereto).

Embodiment 2

Figure 7:
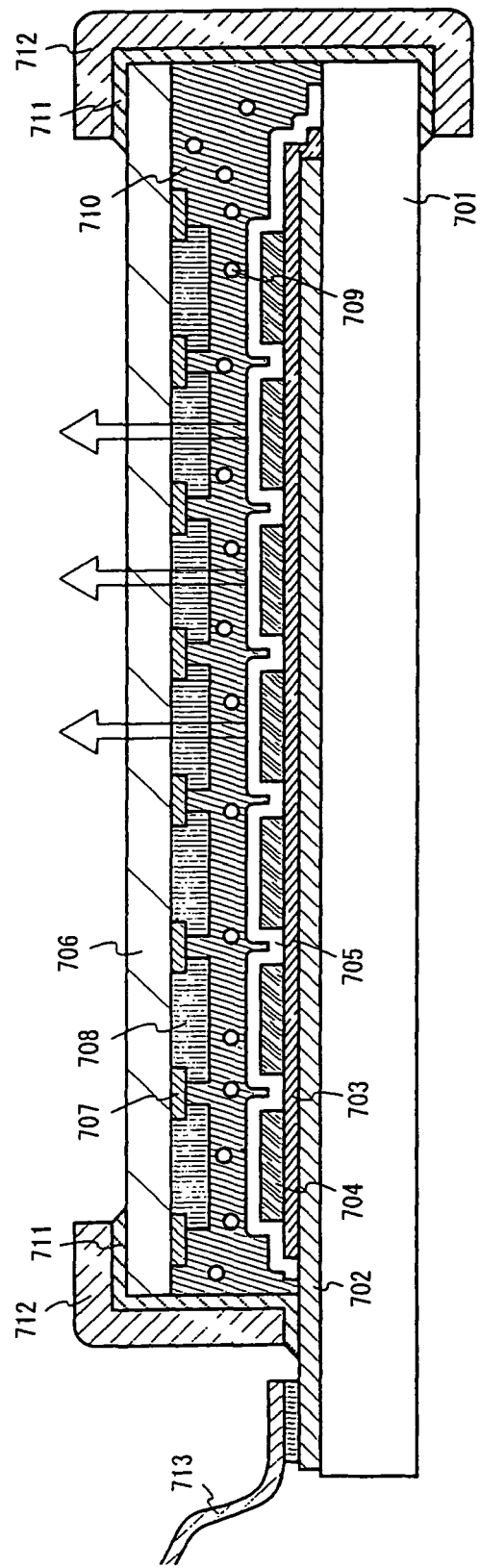
FIG. 7 is a view for illustrating the cross-sectional configuration of a pixel portion of the EL display device.

In the present embodiment, the case where the present invention is applied to a simple-matrix type EL display device will be described with reference to FIG. 7. In FIG. 7, reference numeral 701 denotes a plastic substrate, 702 denotes a cathode made of a layered structure including an aluminum film and a lithium fluoride film (more specifically, the lithium fluoride film is provided so as to be in contact with the EL layer). In the present embodiment, the cathode 702 is formed by the vapor deposition method. Although not illustrated in FIG. 7, a plurality of the cathodes are arranged in stripes along in a direction perpendicular to the drawing sheet.

On the cathode 702, an EL layer 703 (only including a light-emitting layer) made of a high-molecular type EL compound is formed by the printing method. In the present embodiment, PVK (polyvinylcarbazole), Bu-PBD (2-(4'-tert-butyl phenyl)-5-(4"-biphenyl)-1,3,4-oxydiazole), coumarin6, DCM1 (4-dicyanomethylene-2-methyl-6-p-dimethylaminostiryl-4H-pyran), TPB (tetraphenyl butadiene), or Nile Red is dissolved into 1,2-dichloromethane, and the resultant solution is transferred onto the cathode 702 by the printing method and then baked to form the EL layer 703 for emitting white light.

It should be noted that prior to the film formation of the above-mentioned organic compound, the purification process (typically, the dialysis method) is repeated at least three times or more, preferably five times or more, so that the concentration of the ionic impurities contained in the high-molecular type EL compound is reduced to 0.1 ppm or lower (preferably, to 0.01 ppm or lower). Thus, the concentration of the ionic impurities contained in the EL layer 703 is reduced to 0.1 ppm or lower (preferably, to 0.01 ppm or lower), and a volume resistivity of the EL layer 703 is set in the range of $3 \times 10^{10}$ $\Omega$cm or larger. A volume resistivity of a thin film made of a light-emitting organic compound in an EL device is set to be in the range of $1 \times 10^{11}$ to $1 \times 10^{12}$ $\Omega$cm (preferably, in the range from $1 \times 10^{12}$ to $1 \times 10^{13}$ $\Omega$cm).

In the present embodiment, the single-layered structure including only the light-emitting layer is used for the EL layer 703. Alternatively, an electron injection layer, an electron transport layer, a hole transport layer, a hole injection layer, an electron blocking layer, or a hole element layer can be further formed in the EL layer, if necessary.

After the formation of the EL layer 703, an anode 704 made of a transparent conductive film is formed. In this embodiment, a compound of indium oxide and zinc oxide is formed as the transparent conductive film by a vapor deposition method. Although not illustrated in FIG. 7, a plurality of the anodes are arranged in stripes with the longitudinal direction thereof being perpendicular to the drawing sheet so as to be orthogonal to the cathodes. Furthermore, although not illustrated, in order to apply a predetermined voltage to the anodes, wirings are extended from the respective anodes 704 to a portion to which the FPC is to be attached.

Following the formation of the anodes 704, a silicon nitride film is formed to have a thickness of 100 nm as the passivation film 705. This passivation film 705 functions as a protective film for preventing the EL layer 704 from being exposed to the surrounding atmosphere during successive attachment of a cover member or the like.

Thus, the EL devices are formed on the substrate 701. Thereafter, a plastic plate 706 is provided as the cover member 706, and the light-shielding film 707 and the color filter 708 are formed on the surface thereof. A resin containing carbon is used as the light-shielding film 707, and resins respectively containing either red-color pigment, green-color pigment, or blue-color pigment, are used as the respective color filters 708. These films can be formed by an ink jet method, the spin coating method, or the printing method.

In the structure in accordance with the present embodiment, light emitted from the EL device passes through the cover member 706 to reach observer's eyes, and therefore, the cover member 706 is transparent. Instead of a plastic plate used in the present embodiment, any transparent substrate (or a transparent film) such as a glass plate, a PVF film can be used for the cover member 706.

After providing the cover member 706, the cover member 706 is attached by means of a filler agent 710 (functioning as adhesives) to which a drying agent 709 is added. The attachment process can be performed by employing a double-vacuum type attachment apparatus which is used for the fabrication of solar cells. Thereafter, frame members 712 are attached by means of sealing members 711 made of a UV-curable resin. In the present embodiment, a stainless member is used as the frame members 712. Finally, the FPC 713 is attached, thereby completing the EL display device.

Embodiment 3

The EL display device fabricated in accordance with the present invention is of the self-emission type, and thus exhibits more excellent recognizability of the displayed image in a light place as compared to the liquid crystal display device. Furthermore, the EL display device has a wider viewing angle. Accordingly, the EL display device can be applied to a display portion in various electronic devices. For example, in order to view a TV program or the like on a large-sized screen, the EL display device in accordance with the present invention can be used as a display portion of an EL display (i.e., a display in which an EL display device is installed into a frame) having a diagonal size of 30 inches or larger (typically 40 inches or larger.)

The EL display includes all kinds of displays to be used for displaying information, such as a display for a personal computer, a display for receiving a TV broadcasting program, a display for advertisement display. Moreover, the EL display device in accordance with the present invention can be used as a display portion of other various electric devices.

Such electronic devices include a video camera, a digital camera, a goggles-type display (head mount display), a car navigation system, a sound reproduction device (an audio equipment), note-size personal computer, a game machine, a portable information terminal (a mobile computer, a portable telephone, a portable game machine, an electronic book, or the like), an image reproduction apparatus including a recording medium (more specifically, an apparatus which can reproduce a recording medium such as a compact disc (CD), a laser disc (LD), a digital video disc (DVD), and includes a display for displaying the reproduced image), or the like. In particular, in the case of the portable information terminal, use of the EL display device is preferable, since the portable information terminal that is likely to be viewed from a tilted direction is often required to have a wide viewing angle. FIGS. 8A to 8F respectively show various specific examples of such electronic devices.

Figure 8A:
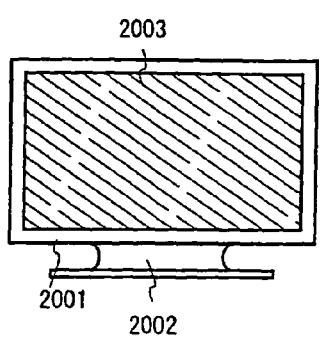
FIGS. 8A to 8F are views for respectively illustrating specific examples of an electronic apparatus.

FIG. 8A illustrates an EL display which includes a frame 2001, a support table 2002, a display portion 2003, or the like. The present invention is applicable to the display portion 2003. The EL display is of the self-emission type and therefore requires no back light. Thus, the display portion thereof can have a thickness thinner than that of the liquid crystal display device.

Figure 8B:
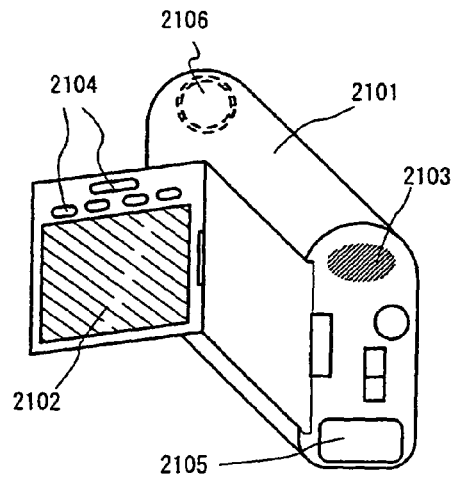

FIG. 8B illustrates a video camera which includes a main body 2101, a display portion 2102, an audio input portion 2103, operation switches 2104, a battery 2105, an image receiving portion 2106, or the like. The EL display device in accordance with the present invention can be used as the display portion 2102.

Figure 8C:
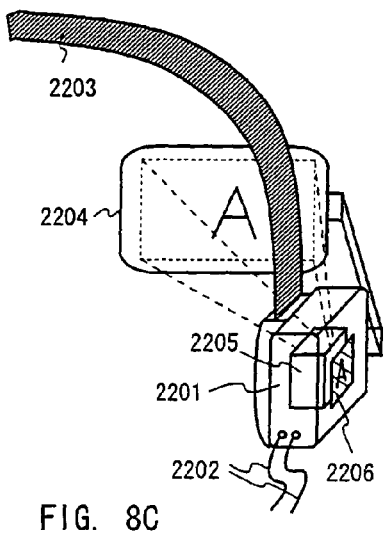

FIG. 8C illustrates a portion (the right-half piece) of an EL display of head mount type, which includes a main body 2201, signal cables 2202, a head mount band 2203, a display portion 2204, an optical system 2205, an EL display device 2206, or the like. The present invention is applicable to the EL display device 2206.

Figure 8D:
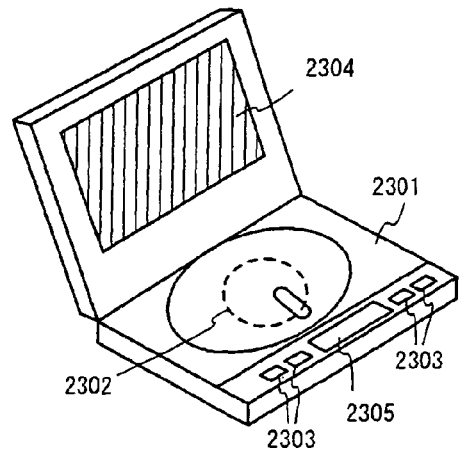

FIG. 8D illustrates an Image reproduction apparatus including a recording medium (more specifically, a DVD reproduction apparatus), which includes a main body 2301, a recording medium (a CD, an LD, a DVD or the like) 2302, operation switches 2303, a display portion (a) 2304, another display portion (b) 2305, or the like. The display portion (a) is used mainly for displaying image information, while the display portion (b) is used mainly for displaying character information. The EL display device in accordance with the present invention can be used as these display portions (a) and (b). The image reproduction apparatus including a recording medium further includes a CD reproduction apparatus, a game machine or the like.

Figure 8E:
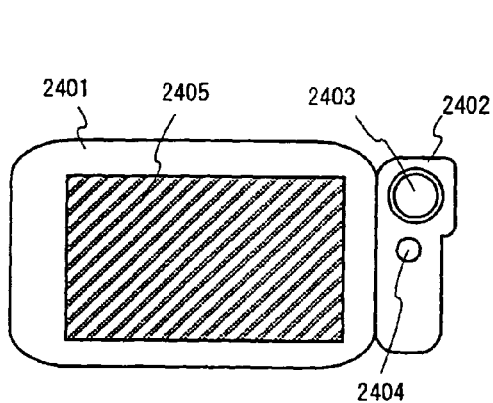

FIG. 8E illustrates a portable (mobile) computer which includes a main body 2401, a camera portion 2402, an image receiving portion 2403, operation switches 2404, a display portion 2405, or the like. The EL display device in accordance with the present invention can be used as the display portion 2405.

Figure 8F:
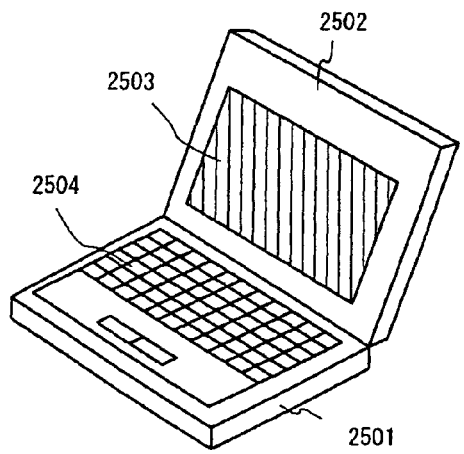

FIG. 8F illustrates a personal computer which includes a main body 2501, a frame 2502, a display portion 2503, a key board 2504, or the like. The EL display device in accordance with the present invention can be used as the display portion 2503.

When the brighter luminance of light emitted from the EL material becomes available in the future, the EL display device in accordance with the present invention will be applicable to a front-type or rear-type projector in which light including output image information is enlarged by means of lenses or the like to be projected.

The aforementioned electronic devices are more likely to be used for display information distributed through a telecommunication path such as Internet, a CATV (cable television system), and in particular likely to display moving picture information. The EL display device is suitable for displaying moving pictures since the EL material can exhibit high response speed. However, if the contour between the pixels becomes unclear, the moving pictures as a whole cannot be clearly displayed. Since the EL display device in accordance with the present invention can make the contour between the pixels clear, it is significantly advantageous to apply the EL display device of the present invention to a display portion of the electronic devices.

A portion of the EL display device that is emitting light consumes power, so it is desirable to display information in such a manner that the light emitting portion therein becomes as small as possible. Accordingly, when the EL display device is applied to a display portion which mainly displays character information, e.g., a display portion of a portable information terminal, and more particular, a portable telephone or a car audio equipment, it is desirable to drive the EL display device so that the character information is formed by a light-emitting portion while a non-emission portion corresponds to the background.

Figure 9A:
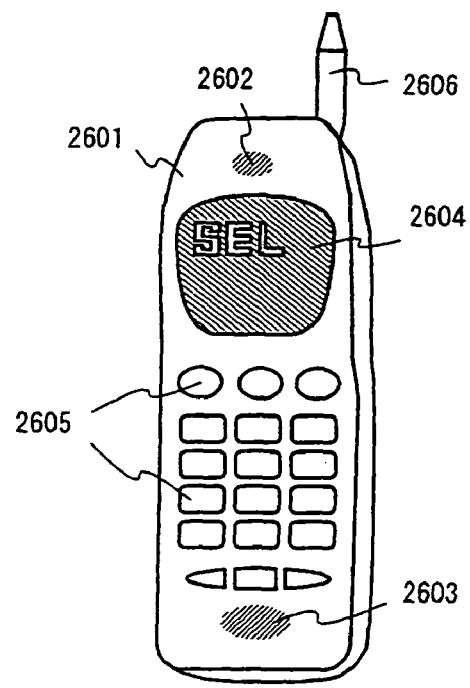
FIGS. 9A and 9B are views for respectively illustrating specific examples of an electronic apparatus.

With now reference to FIG. 9A, a portable telephone is illustrated, which includes a main body 2601, an audio output portion 2602, an audio input portion 2603, a display portion 2604, operation switches 2605, and an antenna 2606. The EL display device in accordance with the present invention can be used as the display portion 2604. The display portion 2604 can reduce power consumption of the portable telephone by displaying white-colored characters on a black-colored background.

Figure 9B:
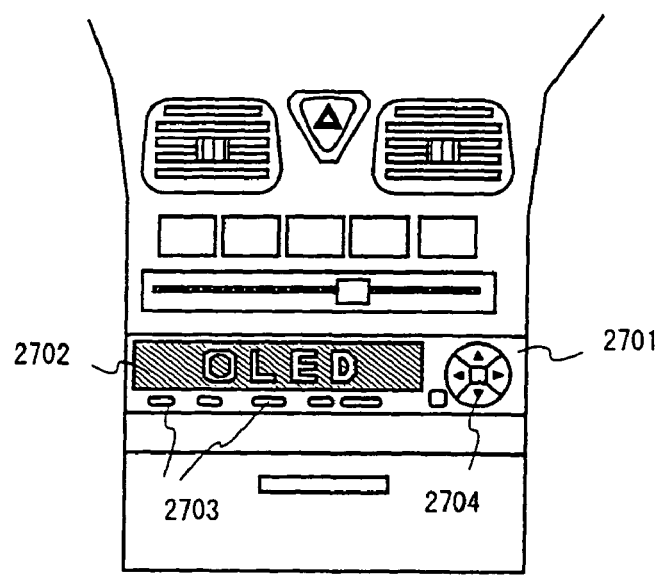

FIG. 9B illustrates a sound reproduction device, a car audio equipment in concrete term, which includes a main body 2701, a display portion 2702, and operation switches 2703 and 2704. The EL display device in accordance with the present invention can be used as the display portion 2704. Although the car audio equipment of the mount type is shown in the present embodiment, the present invention is also applicable to an audio of the set type. The display portion 2702 can reduce power consumption by displaying white-colored characters on a black-colored background, which is particularly advantageous for the audio of the portable type.

As set forth above, the present invention can be applied variously to a wide range of electronic devices in all fields. The electronic device in the present embodiment can be obtained by utilizing an EL display device having the configuration in which the structures in Embodiments 1 through 3 are freely combined.

As set forth above, in accordance with the present invention, deterioration of an EL device can be suppressed, resulting in improved reliability of an EL display device. Furthermore, by using the EL display device obtained in accordance with the present invention as a display portion of an electronic apparatus, reliability of the resultant electronic apparatus can be improved.

What is claimed is:

1. A light-emitting device comprising:
   a substrate;
   a plurality of first electrodes arranged in a stripe shape over the substrate;
   a light-emitting layer over the plurality of first electrodes;
   a plurality of second electrodes arranged in a stripe shape so as to intersect with the plurality of first electrodes, over the light-emitting layer;
   a plurality of color filters over the plurality of second electrodes; and
   a cover member over the plurality of color filters,
   wherein the light-emitting layer comprises total ionic impurities at the concentration of 0.1 ppm or lower.

2. A light emitting element according to claim 1, wherein the cover member is at least one selected from the group consisting of a plastic plate, a glass plate and a PVF film.

3. A light-emitting element according to claim 1, wherein the ionic impurities are sodium or potassium.

4. A light-emitting element according to claim 1, wherein the plurality of first electrodes are cathodes.

5. A light-emitting element according to claim 1, wherein the plurality of second electrodes are anodes.

6. A light-emitting device comprising:
   a substrate;
   a plurality of first electrodes arranged in a stripe shape over the substrate;
   a light-emitting layer over the plurality of first electrodes;
   a plurality of second electrodes arranged in a stripe shape so as to intersect with the plurality of first electrodes, over the light-emitting layer;
   a plurality of color filters over the plurality of second electrodes; and
   a cover member over the plurality of color filters,
   wherein the light-emitting layer comprises total ionic impurities at the concentration of 0.01 ppm or lower.

7. A light emitting element according to claim 6, wherein the cover member is at least one selected from the group consisting of a plastic plate, a glass plate and a PVF film.

8. A light-emitting element according to claim 6, wherein the ionic impurities are sodium or potassium.

9. A light-emitting element according to claim 6, wherein the plurality of first electrodes are cathodes.

10. A light-emitting element according to claim 6, wherein the plurality of second electrodes are anodes.

11. A light-emitting device comprising:
    a substrate;
    a plurality of first electrodes arranged in a stripe shape over the substrate;
    a light-emitting layer over the plurality of first electrodes;
    a plurality of second electrodes arranged in a stripe shape so as to intersect with the plurality of first electrodes, over the light-emitting layer;
    a plurality of color filters over the plurality of second electrodes; and
    a cover member over the plurality of color filters,
    wherein the light-emitting layer comprises total ionic impurities at the concentration of 0.1 ppm or lower and has a volume resistivity of $3\times10^{10}$ $\Omega$cm or larger.

12. A light emitting element according to claim 11, wherein the cover member is at least one selected from the group consisting of a plastic plate, a glass plate and a PVF film.

13. A light-emitting element according to claim 11, wherein the ionic impurities are sodium or potassium.

14. A light-emitting element according to claim 11, wherein the plurality of first electrodes are cathodes.

15. A light-emitting element according to claim 11, wherein the plurality of second electrodes are anodes.

16. A light-emitting device comprising:
    a substrate;
    a plurality of first electrodes arranged in a stripe shape over the substrate;
    a light-emitting layer over the plurality of first electrodes;
    a plurality of second electrodes arranged in a stripe shape so as to intersect with the plurality of first electrodes, over the light-emitting layer;
    a plurality of color filters over the plurality of second electrodes; and
    a cover member over the plurality of color filters,
    wherein the light-emitting layer comprises total ionic impurities at the concentration of 0.01 ppm or lower and has a volume resistivity of $3\times10^{10}$ $\Omega$cm or larger.

17. A light emitting element according to claim 16, wherein the cover member is at least one selected from the group consisting of a plastic plate, a glass plate and a PVF film.

18. A light-emitting element according to claim 16, wherein the ionic impurities are sodium or potassium.

19. A light-emitting element according to claim 16, wherein the plurality of first electrodes are cathodes.

20. A light-emitting element according to claim 16, wherein the plurality of second electrodes are anodes.

21. A light-emitting device comprising:
    a substrate;
    a plurality of first electrodes arranged in a stripe shape over the substrate;
    a light-emitting layer over the plurality of first electrodes;
    a plurality of second electrodes arranged in a stripe shape so as to intersect with the plurality of first electrodes, over the light-emitting layer;
    a plurality of color filters over the plurality of second electrodes; and a cover member over the plurality of color filters,
wherein the light-emitting layer comprises total ionic impurities at the concentration of 0.1 ppm or lower and has a volume resistivity of $1\times10^{11}$ to $1\times10^{12}$ Ωcm.

22. A light emitting element according to claim 21, wherein the cover member is at least one selected from the group consisting of a plastic plate, a glass plate and a PVF film.

23. A light-emitting element according to claim 21, wherein the ionic impurities are sodium or potassium.

24. A light-emitting element according to claim 21, wherein the plurality of first electrodes are cathodes.

25. A light-emitting element according to claim 21, wherein the plurality of second electrodes are anodes.

26. A light-emitting device comprising:
a substrate;
a plurality of first electrodes arranged in a stripe shape over the substrate;
a light-emitting layer over the plurality of first electrodes;
a plurality of second electrodes arranged in a stripe shape so as to intersect with the plurality of first electrodes, over the light-emitting layer;
a plurality of color filters over the plurality of second electrodes; and
a cover member over the plurality of color filters,
wherein the light-emitting layer comprises total ionic impurities at the concentration of 0.01 ppm or lower and has a volume resistivity of $1\times10^{11}$ to $1\times10^{12}$ Ωcm.

27. A light emitting element according to claim 26, wherein the cover member is at least one selected from the group consisting of a plastic plate, a glass plate and a PVF film.

28. A light-emitting element according to claim 26, wherein the ionic impurities are sodium or potassium.

29. A light-emitting element according to claim 26, wherein the plurality of first electrodes are cathodes.

30. A light-emitting element according to claim 26, wherein the plurality of second electrodes are anodes.

31. A light-emitting device comprising:
a substrate;
a plurality of first electrodes arranged in a stripe shape over the substrate;
a light-emitting layer over the plurality of first electrodes;
a plurality of second electrodes arranged in a stripe shape so as to intersect with the plurality of first electrodes, over the light-emitting layer;
an insulating film over the plurality of second electrodes;
an organic liquid filler agent over the insulating film;
a plurality of color filters over the organic liquid filler agent; and
a cover member over the plurality of color filters,
wherein a space between the insulating film and the plurality of color filters is filled with the organic liquid filler agent.

32. A light emitting element according to claim 31, wherein the cover member is at least one selected from the group consisting of a plastic plate, a glass plate and a PVF film.

33. A light-emitting element according to claim 31, wherein the plurality of first electrodes are cathodes.

34. A light-emitting element according to claim 31, wherein the plurality of second electrodes are anodes.

35. A light-emitting element according to claim 31, further comprising a sealing member for bonding the substrate and the cover member.

36. A light-emitting element according to claim 31, wherein a drying agent is added to the organic liquid filler agent.

37. A light-emitting device comprising:
a substrate;
a plurality of first electrodes arranged in a stripe shape over the substrate;
a light-emitting layer over the plurality of first electrodes;
a plurality of second electrodes arranged in a stripe shape so as to intersect with the plurality of first electrodes, over the light-emitting layer;
an insulating film over the plurality of second electrodes;
a plurality of color filters over the insulating film; and
a cover member over the plurality of color filters,
wherein the light-emitting layer comprises sodium at the concentration of $7\times10^{17}$ atoms/cm$^3$ or lower, and
wherein a space between the insulating film and the plurality of color filters is filled with an organic liquid filler agent.

38. A light emitting element according to claim 37, wherein the cover member is at least one selected from the group consisting of a plastic plate, a glass plate and a PVF film.

39. A light-emitting element according to claim 37, wherein the ionic impurities are sodium or potassium.

40. A light-emitting element according to claim 37, wherein the plurality of first electrodes are cathodes.

41. A light-emiting element according to claim 37, wherein the plurality of second electrodes are anodes.

42. A light-emitting element according to claim 37, wherein the organic liquid filler agent includes a drying agent.

* * * * *